US012777582B2

(12) United States Patent
Katsura et al.

(10) Patent No.: US 12,777,582 B2
(45) Date of Patent: Oct. 27, 2026

(54) MULTILAYER SUBSTRATE

(71) Applicant: Murata Manufacturing Co., Ltd., Nagaokakyo (JP)

(72) Inventors: Tomonori Katsura, Nagaokakyo (JP); Kouki Shimizu, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 204 days.

(21) Appl. No.: 18/773,667

(22) Filed: Jul. 16, 2024

(65) Prior Publication Data

US 2024/0373549 A1 Nov. 7, 2024

Related U.S. Application Data

(63) Continuation of application No. PCT/JP2023/008894, filed on Mar. 8, 2023.

(30) Foreign Application Priority Data

Mar. 17, 2022 (JP) ................................ 2022-042984

(51) Int. Cl.
*H05K 1/02* (2006.01)
*H05K 1/11* (2006.01)

(52) U.S. Cl.
CPC ........... *H05K 1/0298* (2013.01); *H05K 1/115* (2013.01)

(58) Field of Classification Search
None
See application file for complete search history.

(56) References Cited

U.S. PATENT DOCUMENTS 5,712,607 A * 1/1998 Dittmer .................. H01P 3/087 333/246
2011/0064369 A1 3/2011 Furuyama et al.
2015/0327357 A1* 11/2015 Khan ...................... H01P 3/084 333/243
2016/0381786 A1* 12/2016 Hu ....................... H05K 3/4697 174/254
2023/0022402 A1 1/2023 Ikemoto et al.

FOREIGN PATENT DOCUMENTS

JP 2002118361 A 4/2002
JP 2009124044 A 6/2009
JP 2011066086 A 3/2011
JP 2014078835 A 5/2014
JP 2016004875 A * 1/2016 ............. H01P 3/085
JP 2016509391 A 3/2016
WO 2021215216 A1 10/2021

OTHER PUBLICATIONS

JP 2016004875 A (Translation) (Year: 2026).*
International Search Report in PCT/JP2023/008894, mailed May 30, 2023, 3 pages.
Written Opinion in PCT/JP2023/008894, mailed May 30, 2023, 4 pages.

* cited by examiner

*Primary Examiner* — Timothy J Thompson
*Assistant Examiner* — John B Freal
(74) *Attorney, Agent, or Firm* — Keating & Bennett, LLP

(57) ABSTRACT

A multilayer substrate includes a multilayer body that includes plastic resin layers and a space inside the multilayer body, a first inner layer resin in the space, and conductors that include a signal conductor and are located on the first inner layer resin, in which at least a portion of the first inner layer resin is separated from the multilayer body in the space.

16 Claims, 28 Drawing Sheets

MULTILAYER SUBSTRATE

CROSS REFERENCE TO RELATED APPLICATIONS

This application claims the benefit of priority to Japanese Patent Application No. 2022-042984 filed on Mar. 17, 2022 and is a Continuation Applications of PCT Application No. PCT/JP2023/008894 filed on Mar. 8, 2023. The entire contents of each application are hereby incorporated herein by reference.

BACKGROUND OF THE INVENTION

1. Field of the Invention

The present invention relates to multilayer substrates each including a plurality of conductors.

2. Description of the Related Art

For example, a high-speed transmission laminated substrate according to Japanese Unexamined Patent Application Publication No. 2002-118361 has been known as an invention related to a multilayer substrate in the related art. The high-speed transmission laminated substrate is a high-speed transmission substrate using a flex substrate consisting of a copper foil and a resin insulating base material and has a configuration including a high-speed transmission signal wire, in which a surrounding area of the high-speed transmission signal wire consists of an air layer.

In the multilayer substrate according to Japanese Unexamined Patent Application Publication No. 2002-118361, bending the multilayer substrate poses a concern of variations in a clearance between the signal wire and the copper foil.

SUMMARY OF THE INVENTION

Example embodiments of the present invention provide multilayer substrates that each reduce or prevent variations in a clearance between a plurality of conductors.

A multilayer substrate according to an example embodiment of the present invention includes a multilayer body including a plurality of laminated plastic resin layers and a space inside the multilayer body, a first inner layer resin in the space, and a plurality of conductors including a signal conductor and provided on the first inner layer resin, in which at least a portion of the first inner layer resin is separated from the multilayer body in the space, the plurality of conductors include a plurality of inner layer ground conductors, the signal conductor is between the plurality of inner layer ground conductors, the multilayer body includes a first main surface and a second main surface facing each other in a lamination direction of the multilayer body, the multilayer substrate further includes a plurality of conductive shield materials on the first main surface and on the second main surface, in the lamination direction, the plurality of conductive shield materials overlap with the signal conductor, and in a cross section in a direction perpendicular or substantially perpendicular to an extending direction of the signal conductor, the first inner layer resin is floating from the multilayer body.

According to example embodiments of the present invention, variations in a clearance between a plurality of conductors are reduced or prevented.

The above and other elements, features, steps, characteristics and advantages of the present invention will become more apparent from the following detailed description of the example embodiments with reference to the attached drawings.

DETAILED DESCRIPTION OF THE EXAMPLE EMBODIMENTS

Example embodiments of the present invention will be described in detail below with reference to the drawings.

Figure 1:
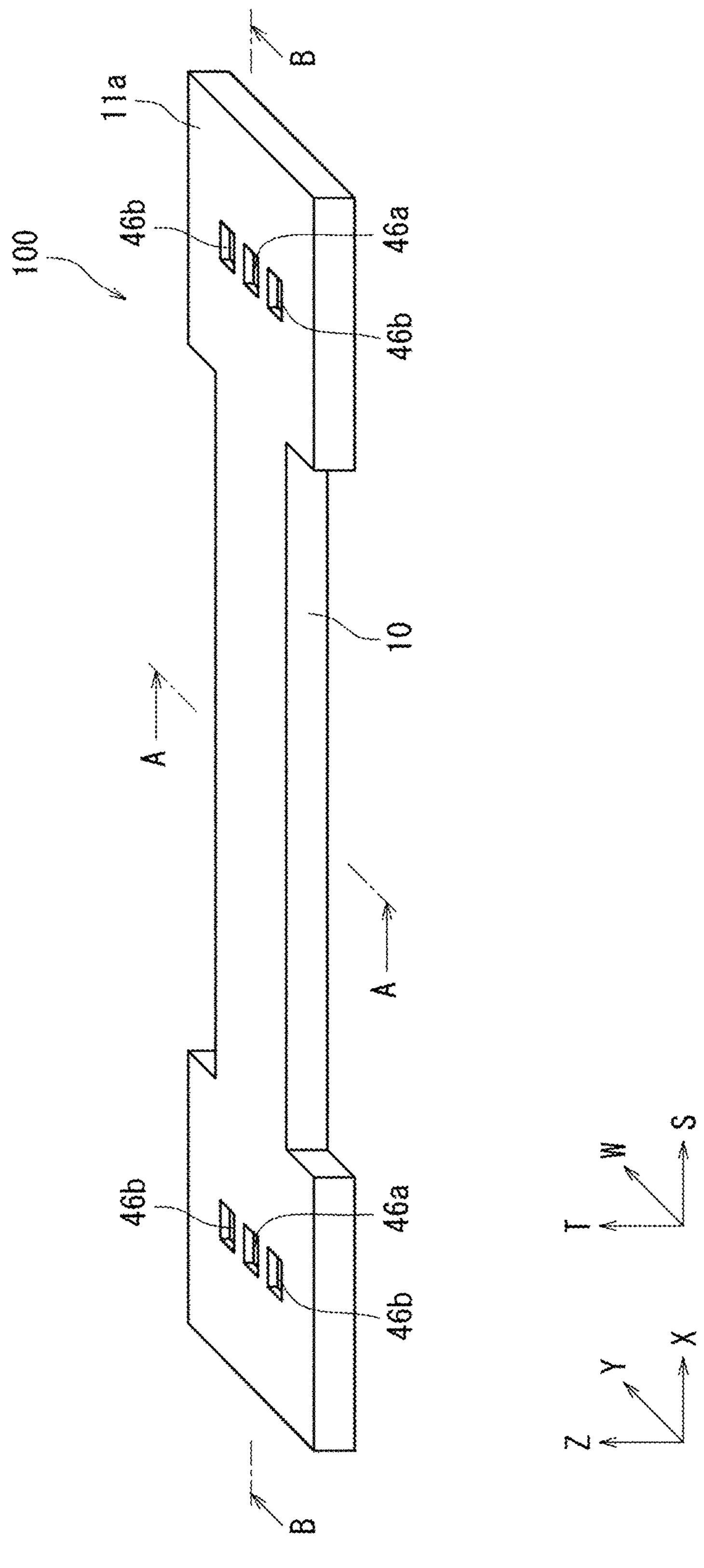
FIG. 1 is an exterior perspective view of a multilayer substrate according to a first example embodiment of the present invention.
Figure 2:
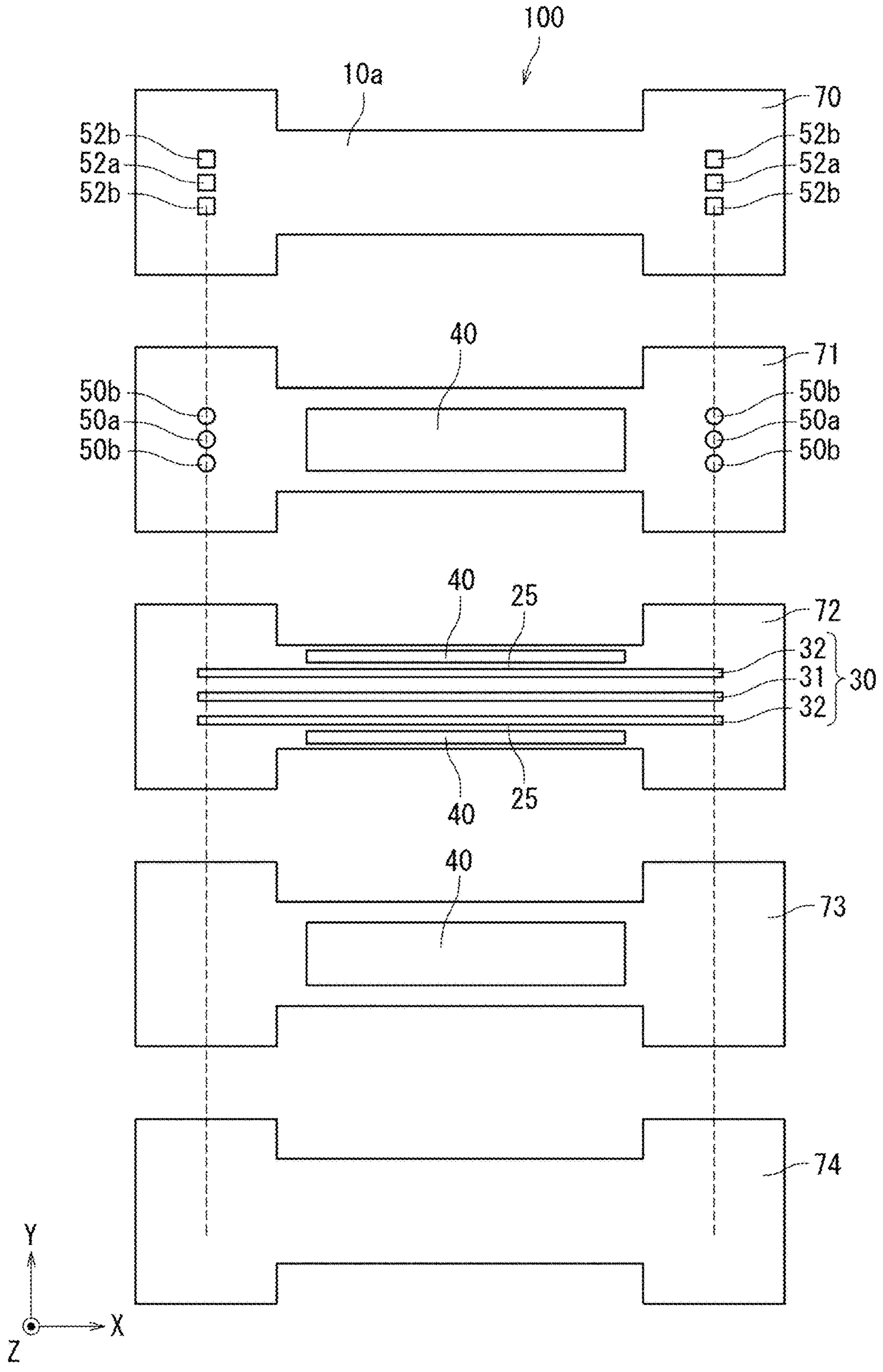
FIG. 2 is an exploded top view of the multilayer substrate according to the first example embodiment of the present invention.
Figure 3:
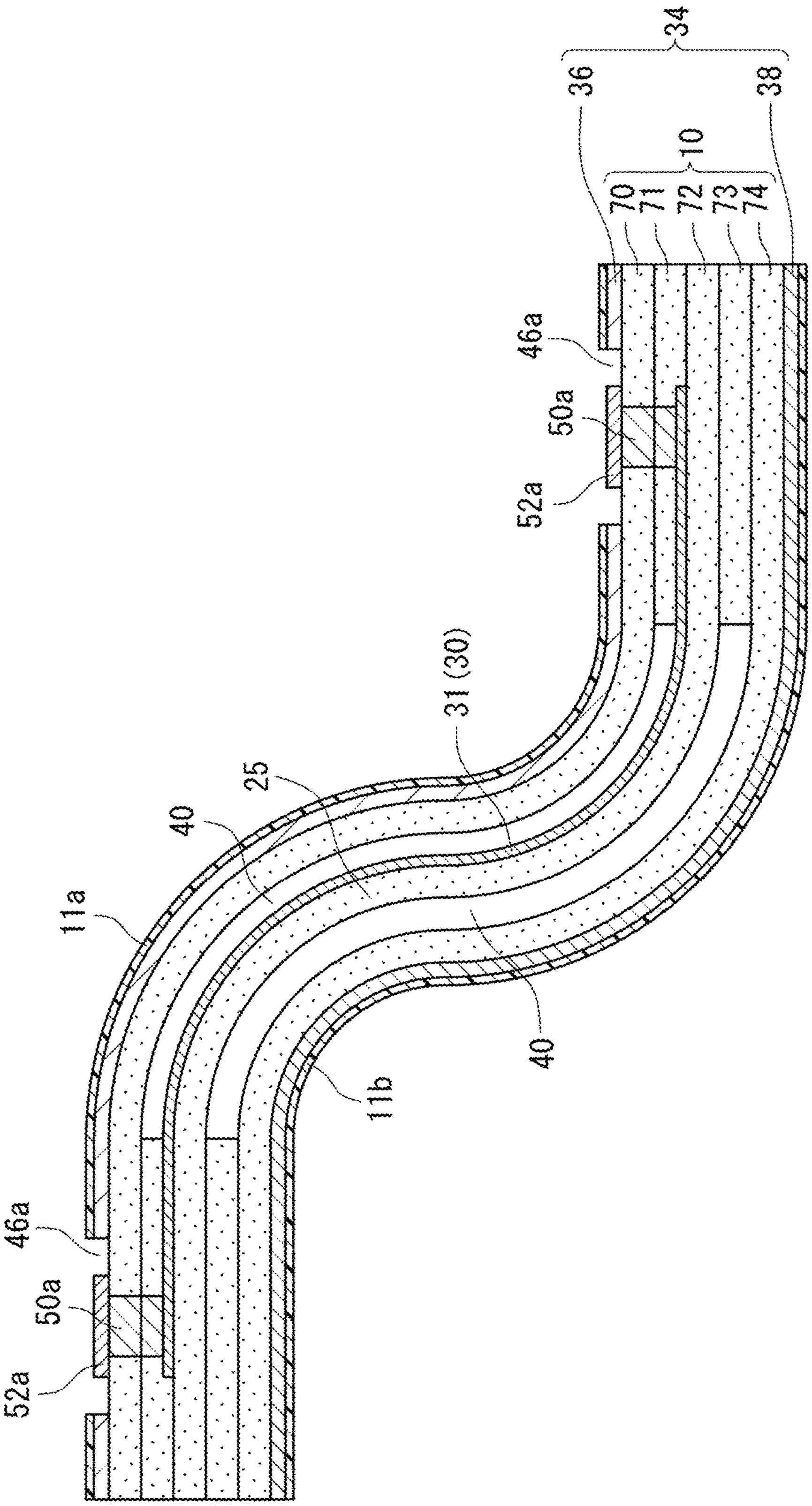
FIG. 3 is a horizontal cross-sectional view of the multilayer substrate after deformation according to the first example embodiment of the present invention.
Figure 4:
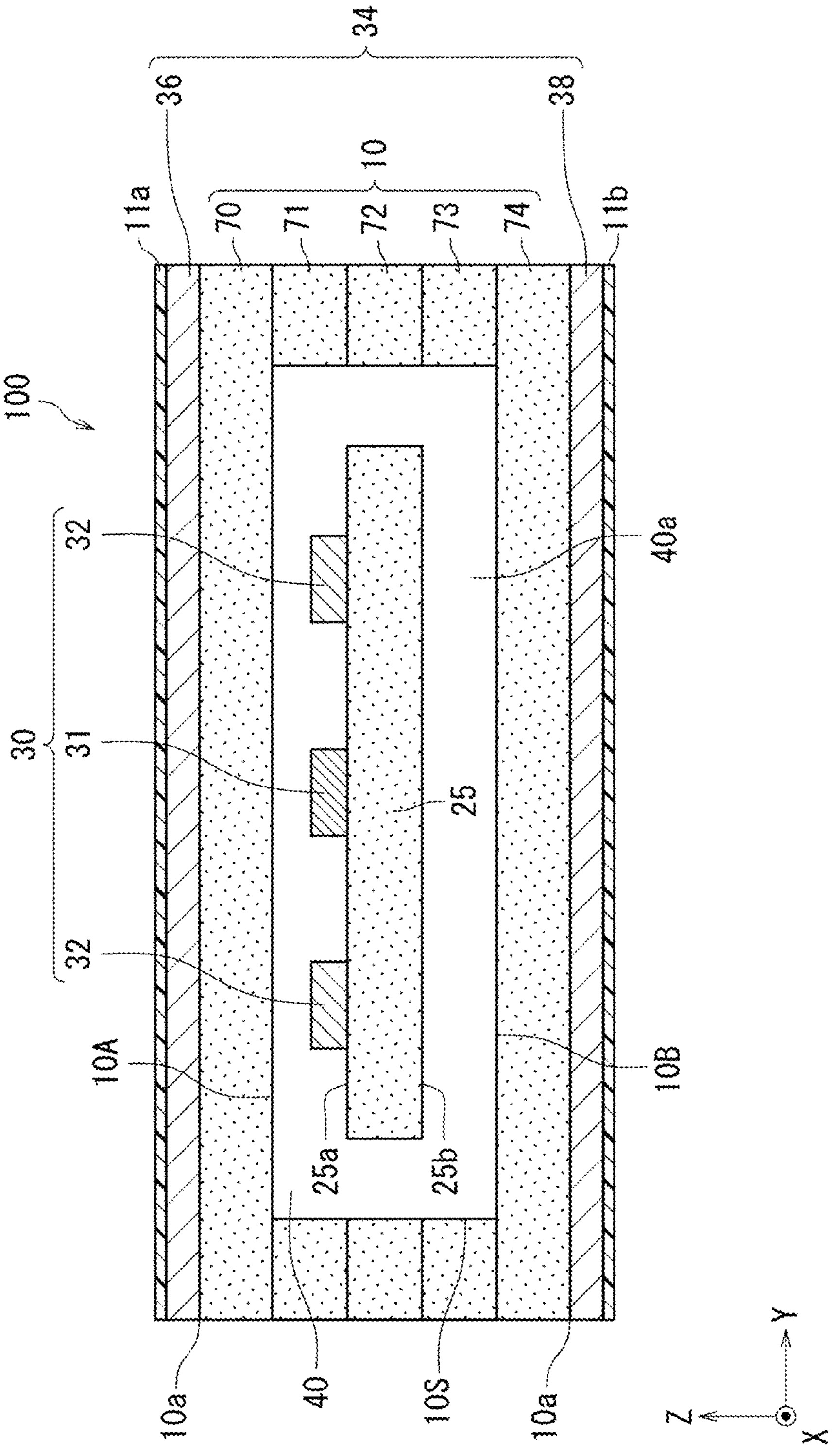
FIG. 4 is a cross-sectional view taken along a line A-A in FIG. 1.
Figure 5:
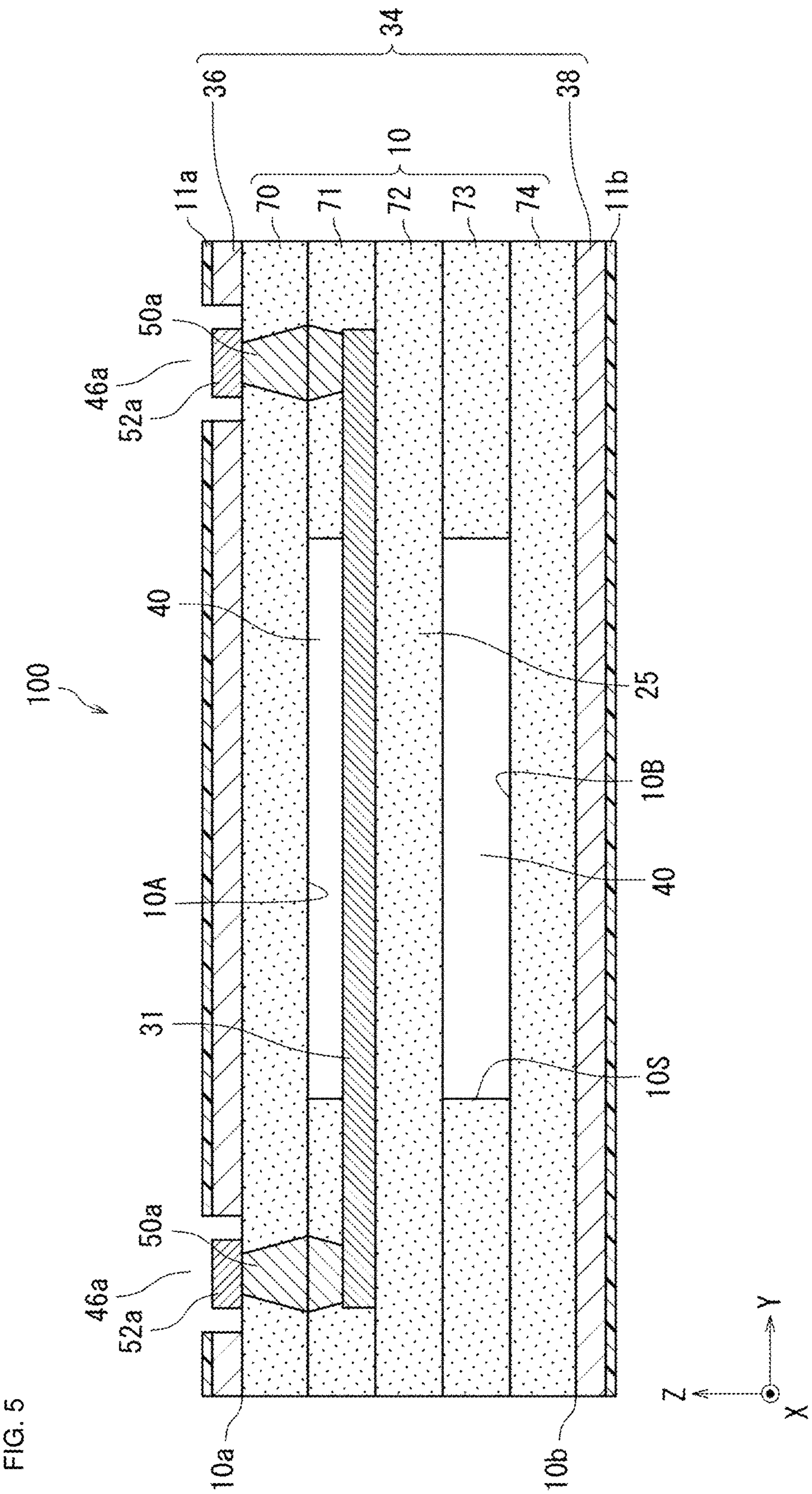
FIG. 5 is a cross-sectional view taken along a line B-B in FIG. 1.

A structure of a multilayer substrate 100 according to an example embodiment of the present invention will be described with reference to the accompanying drawings. FIG. 1 is an exterior perspective view of the multilayer substrate 100. FIG. 2 is a top view of each layer of the multilayer substrate 100 in view in a thickness direction. FIG. 3 is a horizontal cross-sectional view of the multilayer substrate 100 after deformation according to a first example embodiment. FIG. 4 is a cross-sectional view taken along a line A-A of the multilayer substrate 100, and FIG. 5 is a cross-sectional view taken along a line B-B of the multilayer substrate 100.

In the present specification, directions are defined as follows. First, an X axis direction corresponds to a substrate extending direction S of the multilayer substrate 100. A Y axis direction corresponds to a width direction W of the multilayer substrate 100. A Z axis direction corresponds to a thickness direction T of the multilayer substrate 100. The substrate extending direction S is a direction in which the multilayer substrate 100 extends in view in the thickness direction T. The width direction W is a direction orthogonal or substantially orthogonal to the direction in which the multilayer substrate 100 extends in the view in the thickness direction T. The thickness direction T is a lamination direction in which at least one plastic resin layer 70 is laminated. The thickness direction T, the width direction W, and the substrate extending direction S are orthogonal or substantially orthogonal to each other. It is possible that the thickness direction T, the width direction W, and the substrate extending direction S in the present specification do not match a thickness direction, a width direction, and a signal transmission direction during actual use of the multilayer substrate 100.

Hereinafter, definitions of terms in the present specification will be described. First, a positional relationship between members in the present specification will be defined. In the present specification, the expression "A and B are electrically connected to each other" means that electricity can be conducted between A and B. Accordingly, it is possible that A and B are in contact with each other, or A and B are not in contact with each other. For example, in a case where C having conductivity is disposed between A and B, A and B are electrically connected to each other with C interposed between A and B even in a case where A and B are not in contact with each other. In the present specification, the expression "A and B are in contact with each other" means that A and B are connected to each other in a state of being in contact with each other.

In the present specification, terms such as "first" and "second" are used for only descriptive purposes and should not be understood as explicitly or implicitly indicating an order of relative importance or technical features. Features limited by "first" and "second" explicitly or implicitly indicate that one or more of the features are included.

The structure of the multilayer substrate 100 will be described with reference to FIG. 1. The multilayer substrate 100 is a multilayer substrate for transmitting a high-frequency signal. The multilayer substrate 100 is, for example, a multilayer substrate to electrically connect two circuits in an electronic apparatus such as a smartphone. The multilayer substrate 100 has plasticity and can be bent or folded, as appropriate.

The multilayer substrate 100 of the first example embodiment has a shape extending in the substrate extending direction S, as illustrated in FIG. 1.

Next, specific elements of the multilayer substrate 100 will be described.

As illustrated in FIGS. 1 to 5, the multilayer substrate 100 includes a multilayer body 10, a first inner layer resin 25, a plurality of conductors 30, and conductive shield materials 34.

Multilayer Body

The multilayer body 10 has a plate shape including a first main surface 10*a* and a second main surface 10*b* that are separated from each other in the thickness direction T. Specifically, the first main surface 10*a* and the second main surface 10*b* face each other. In the present specification, the first main surface 10*a* may be referred to as an upper main surface, and the second main surface 10*b* may be referred to as a lower main surface.

As illustrated in FIGS. 4 and 5, a space 40 is provided inside the multilayer body 10.

The multilayer body 10 includes a plurality of laminated plastic resin layers 70, 71, 72, 73, and 74. The plastic resin layers 70, 71, 72, 73, and 74 are laminated along the thickness direction T. Specifically, the plastic resin layers 70, 71, 72, 73, and 74 are laminated in this order in a direction from the first main surface 10*a* to the second main surface 10*b*. The plastic resin layers 70, 71, 72, 73, and 74 have plate shapes having the same or approximately the same dimensions. In the present example embodiment, in the thickness direction T, a surface in an outer side portion of the plastic resin layer 70 defines the first main surface 10*a*, and a surface in an outer side portion of the plastic resin layer 74 defines the second main surface 10*b*.

The space 40 can be provided by, for example, removing a portion of the plastic resin layers 71, 72, and 73. In the present example embodiment, the plastic resin layers 71, 72, and 73 include holes to define the space 40. In the view in the thickness direction T, the plastic resin layers 71, 72, and 73 are provided with, for example, rectangular or substantially rectangular holes. The plastic resin layers 70 and 74 are not provided with holes and have continuous shapes. In the multilayer body 10, a plurality of holes provided in the plastic resin layers 71, 72, and 73 communicate with each other in the thickness direction T. The plastic resin layers 71, 72, and 73 are sandwiched between the plastic resin layers 70 and 74 in the thickness direction T. The plastic resin layer 70 closes a cavity of the hole of the plastic resin layer 71, and the plastic resin layer 74 closes a cavity of the hole of the plastic resin layer 73. Accordingly, the space 40 defined by the plurality of continuous holes is provided inside the multilayer body 10. The space 40 has a rectangular or substantially rectangular shape in the view in the thickness direction T. Air is present in the space 40.

The plastic resin layers 70, 71, 72, 73, and 74 are, for example, dielectric sheets having plasticity. In the present example embodiment, materials of the plastic resin layers 70, 71, 72, 73, and 74 are, for example, thermoplastic resins. The thermoplastic resins include, for example, a liquid crystal polymer and polytetrafluoroethylene (PTFE). The materials of the plastic resin layers 70, 71, 72, 73, and 74 may be, for example, thermosetting resins or polyimide. The thermosetting resins include, for example, polyimide.

The multilayer body 10 includes an inner surface that defines the space 40. More specifically, the multilayer body 10 includes a first inner wall 10A facing the first main surface 10*a*, a second inner wall 10B facing the second main surface 10*b*, and inner side walls 10S connecting the first inner wall 10A and the second inner wall 10B to each other.

The first inner wall 10A is defined by the plastic resin layer 70. Specifically, the first inner wall 10A is an inner surface of the plastic resin layer 70 on a side connected to the plastic resin layer 71. The first inner wall 10A is provided on a side opposite to the first main surface 10*a* formed on the plastic resin layer 71.

The second inner wall 10B is defined by the plastic resin layer 74. Specifically, the second inner wall 10B is an inner surface of the plastic resin layer 74 on a side connected to the plastic resin layer 73. The second inner wall 10B is provided on a side opposite to the second main surface 10*b* formed on the plastic resin layer 74.

The inner side walls 10S are defined by the plastic resin layers 71, 72, and 73. Specifically, the inner side walls 10S include a plurality of inner wall surfaces that define the holes provided in the plastic resin layers 71, 72, and 73. While the space 40 is defined by a plurality of inner walls in the present example embodiment, the space 40 may be defined by one inner wall. Examples include a spherical inner wall.

First Inner Layer Resin

The first inner layer resin 25 is disposed in the space 40 of the multilayer body 10. The first inner layer resin 25 has a sheet shape extending in the substrate extending direction S of the multilayer substrate 100. The first inner layer resin 25 includes a third main surface 25*a* and a fourth main surface 25*b* that are separated from each other in the thickness direction T.

The first inner layer resin 25 is made of a resin having plasticity. Thus, the first inner layer resin 25 can be bent or folded by a load of an external force. For example, in a case where an external force is applied to the multilayer body 10 as a load, the first inner layer resin 25 deforms to bend in the space 40 as illustrated in FIG. 3.

The first inner layer resin 25 extends in an extending direction of a signal conductor 31 and is connected to the multilayer body 10 in the extending direction. In other words, the first inner layer resin 25 is connected to the multilayer body 10 in the substrate extending direction S of the multilayer substrate 100. Specifically, both end portions of the first inner layer resin 25 in the substrate extending direction S of the multilayer substrate 100 are connected to the inner side walls 10S of the multilayer body 10.

The first inner layer resin 25 is separated from the multilayer body 10 in the space 40. Specifically, in a cross section in a direction (Z direction) perpendicular or substantially perpendicular to the extending direction of the signal conductor 31, the first inner layer resin 25 in the space 40 is separated from the first inner wall 10A, the second inner wall 10B, and the inner side walls 10S of the multilayer body 10 and is floating from the multilayer body 10. That is, in the cross section in the direction (Z direction) perpendicular or substantially perpendicular to the extending direction of the signal conductor 31, a hollow portion 40*a* that surrounds the first inner layer resin 25 in an annular shape is provided inside the multilayer body 10. For example, the hollow portion 40*a* is air.

In the space 40, a portion of the first inner layer resin 25 may be in contact with the multilayer body 10. For example, in a state where the multilayer substrate 100 is bent or folded, a portion of the first inner layer resin 25 may be in contact with the multilayer body 10. That is, at least a portion of the first inner layer resin 25 may be separated from the multilayer body 10 in the space 40.

In the present example embodiment, the first inner layer resin 25 is integrally provided with the plastic resin layer 72. Thus, the first inner layer resin 25 is made of the same resin as the plastic resin layer 72. In other words, the first inner layer resin 25 is a portion of the multilayer body 10.

The first inner layer resin 25 may be provided as a member separated from the plastic resin layer 72 or may be made of a different material from the plastic resin layer 72.

Plurality of Conductors

As illustrated in FIG. 2, the plurality of conductors 30 are conductor patterns provided in a portion of the multilayer body 10 and in the first inner layer resin 25 and extend along the substrate extending direction S. As illustrated in FIG. 4, the plurality of conductors 30 are provided on the third main surface 25*a* of the first inner layer resin 25.

The plurality of conductors 30 may be provided on at least one of the third main surface 25*a* or the fourth main surface 25*b* of the first inner layer resin 25.

The plurality of conductors 30 include the signal conductor 31 and a plurality of inner layer ground conductors 32. The plurality of conductors 30 are, for example, conductor layers formed by patterning a metal foil bonded to the plastic resin layer 70. The metal foil is, for example, a copper foil. The plurality of conductors may be formed by, for example, plating.

The signal conductor 31 is a conductor to transmit a signal. In the present example embodiment, the signal conductor 31 transmits a high-frequency signal. The signal conductor 31 is disposed at an interval between two inner layer ground conductors 32.

As illustrated in FIGS. 2 and 5, both ends of the signal conductor 31 in the substrate extending direction S are disposed on the plastic resin layer 72 that defines the multilayer body 10. Specifically, both ends of the signal conductor 31 in the substrate extending direction S are disposed on a portion of the plastic resin layer 72 laminated with the plastic resin layer 71. Both ends of the signal conductor 31 in the substrate extending direction S are connected to interlayer connection conductors 50*a* provided in the plastic resin layers 70 and 71.

The interlayer connection conductors 50*a* are disposed in through-holes provided in the plastic resin layers 70 and 71 in the thickness direction. The interlayer connection conductors 50*a* are connected to extended conductors 52*a* provided on the first main surface 10*a* of the plastic resin layer 70.

The extended conductors 52*a* are disposed in cavities 46*a* provided in the conductive shield material 34 and a protective film 11*a* disposed on the first main surface 10*a* of the multilayer body 10.

Each of the plurality of inner layer ground conductors 32 is connected to a ground potential. As illustrated in FIG. 2, the plurality of inner layer ground conductors 32 are disposed at an interval at positions between which the signal conductor 31 is interposed. Both ends of the plurality of inner layer ground conductors 32 in the substrate extending direction S are disposed on the plastic resin layer 72 that defines the multilayer body 10, similar to those of the signal conductor 31. Specifically, both ends of the plurality of inner layer ground conductors 32 in the substrate extending direction S are disposed on a portion of the plastic resin layer 72 laminated with the plastic resin layer 71. Both ends of the plurality of inner layer ground conductors 32 in the substrate extending direction S are connected to interlayer connection conductors 50*b* provided in the plastic resin layer 71.

The interlayer connection conductors 50*b* are disposed in through-holes provided in the plastic resin layers 70 and 71 in the thickness direction. The interlayer connection conductors 50*b* are connected to extended conductors 52*b* provided in the plastic resin layer 70.

The extended conductors 52*b* are disposed in cavities 46*b* provided in the conductive shield material 34 and the protective film 11*a* disposed on the first main surface 10*a* of the multilayer body 10.

Conductive Shield Material

As illustrated in FIG. 4, the conductive shield materials 34 are provided on the first main surface 10*a* and the second main surface 10*b* of the multilayer body 10. Specifically, the conductive shield materials 34 are film-shaped conductor patterns that are provided on the plastic resin layers 70 and 74 and that cover main surfaces of the plastic resin layers 70 and 74 in the thickness direction. The conductive shield materials 34 are conductor layers formed by patterning metal foils bonded to the plastic resin layers 70 and 74. The metal foils are, for example, copper foils.

The conductive shield materials 34 include a first ground conductor 36 and a second ground conductor 38. The first ground conductor 36 is disposed on the first main surface 10*a* of the multilayer body 10. The second ground conductor 38 is disposed on the second main surface 10*b* of the multilayer body 10.

Each of the first ground conductor 36 and the second ground conductor 38 is connected to the ground potential. For example, the first ground conductor 36 and the second ground conductor 38 reduce or prevent an effect of external noise on the signal conductor 31.

The protective films 11*a* and 11*b* are disposed on surfaces of the conductive shield materials 34.

The protective film 11*a* is, for example, a protective layer to protect the first ground conductor 36 disposed on the first main surface 10*a* of the multilayer body 10. The protective film 11*b* is, for example, a protective layer to protect the second ground conductor 38 disposed on the second main surface 10*b* of the multilayer body 10. The protective films 11*a* and 11*b* cover the entire or substantially the entire surfaces of the first main surface 10*a* and the second main surface 10*b* of the multilayer body 10, respectively. In the present example embodiment, the protective films 11*a* and 11*b* are, for example, resin resists applied to the multilayer body 10. The protective films 11*a* and 11*b* may be, for example, coverlays bonded to the multilayer body 10.

As illustrated in FIG. 1, a plurality of cavities 46*a* and 46*b* are provided in the protective film 11*a*. The cavities 46*a* and 46*b* are provided for external connection to the plurality of conductors 30. While illustration is not provided in FIG. 1, the extended conductors 52*a* and 52*b* electrically connected to the plurality of conductors 30 are disposed in the plurality of cavities 46*a* and 46*b*.

A positional relationship between the first inner layer resin 25 and the space 40 will be described with reference to FIGS. 4 and 5.

The first inner layer resin 25 overlaps with the space 40 in the view in the thickness direction T. In the multilayer substrate 100, the space 40 is provided in a position in which the first inner layer resin 25 is interposed in the thickness direction T and in the width direction W. The first inner layer resin 25 is separated from inner surfaces of the multilayer body 10 in the thickness direction and in the width direction W. Specifically, the first inner layer resin 25 is separated from the first inner wall 10A and the second inner wall 10B in the thickness direction T. While the first inner layer resin 25 is separated from the inner side wall 10S in the width direction W, the first inner layer resin 25 is connected to the inner side wall 10S in the substrate extending direction S.

As illustrated in FIG. 4, the plurality of conductors 30 are disposed to face the first ground conductor 36 and the second ground conductor 38 in the view in the thickness direction T.

With such a configuration of the multilayer substrate 100, variations in a clearance between the plurality of conductors 30 caused by deformation of the multilayer substrate 100 can be reduced or prevented.

For example, in a case where the multilayer substrate 100 is bent or folded in the thickness direction T, an outer side portion of the multilayer body 10 bends to deform as illustrated in FIG. 3. In this case, in a case where the plurality of conductors 30 are not disposed on the first inner layer resin 25 and where only the conductor patterns are disposed in the space 40, a degree of deformation of the plurality of conductors 30 may vary. In that case, it is considered that the clearance between the plurality of conductors 30 varies, and signal characteristics deteriorate.

The multilayer substrate 100 according to the present example embodiment includes the multilayer body 10, the first inner layer resin 25, and the plurality of conductors 30. The multilayer body 10 includes the plurality of laminated plastic resin layers 70 to 74, and the space 40 is provided inside the multilayer body 10. The first inner layer resin 25 is disposed in the space 40 of the multilayer body 10. The plurality of conductors 30 include a signal conductor and are disposed on the first inner layer resin 25. In such a configuration, the plurality of conductors 30 deform in accordance with deformation of the first inner layer resin 25. Thus, the plurality of conductors 30 are likely to deform in the same or similar manner. Accordingly, a difference in deformation between the plurality of conductors 30 is unlikely to occur. Consequently, even in a case where the multilayer substrate 100 deforms, variations in the clearance between the plurality of conductors 30 can be reduced or prevented.

In the present example embodiment, the signal conductor 31 is used as a high-frequency signal, and a high-frequency signal is transmitted through the signal conductor 31. Accordingly, reduction or prevention of deterioration in the signal characteristics by reducing or preventing a change in the clearance with respect to the inner layer ground conductor 32 can be expected. A signal, for example, a lowfrequency signal, different from the high-frequency signal may be transmitted through the signal conductor 31.

In the present example embodiment, a configuration in which the interlayer connection conductors 50*a* and 50*b* and the extended conductors 52*a* and 52*b* are provided in the plastic resin layers 70 and 71 on one side and another side of the multilayer body 10 in the substrate extending direction S has been described. In this configuration, the extended conductors 52*a* and 52*b* are disposed in the cavities 46*a* and 46*b* provided in the conductive shield material 34 and the protective film 11*a* disposed on the first main surface 10*a* of the multilayer body 10. The interlayer connection conductors 50*a* and 50*b* and the extended conductors 52*a* and 52*b* may be provided in the plastic resin layers 73 and 74 on at least one of one side or the other side of the multilayer body 10 in the substrate extending direction S. In this configuration, the cavities 46*a* and 46*b* may be provided in the conductive shield material 34 and the protective film 11*a* disposed on the second main surface 10*b* of the multilayer body 10. The extended conductors 52*a* and 52*b* may be disposed in the cavities 46*a* and 46*b* provided in the conductive shield material 34 and the protective film 11*a* disposed on the second main surface 10*b* of the multilayer body 10.

First Modified Example

Hereinafter, a multilayer substrate according to a first modified example of the first example embodiment will be described with reference to the accompanying drawings. In the first modified example of the first example embodiment, duplicate elements of the first example embodiment will not be described, as appropriate. The same applies to the following modified examples and example embodiments.

Figure 6:
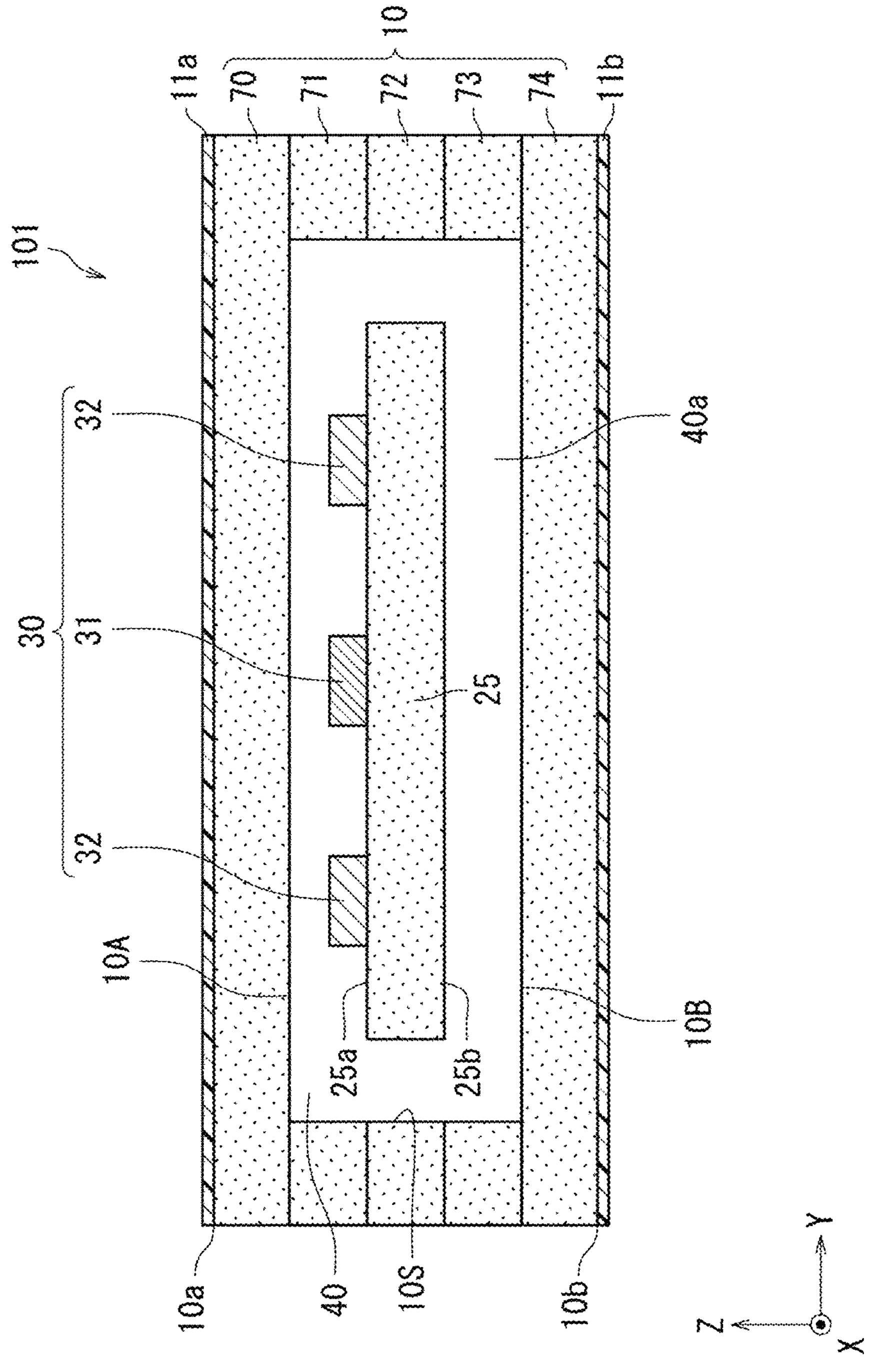
FIG. 6 is a vertical cross-sectional view of a multilayer substrate according to a first modified example of an example embodiment of the present invention.

FIG. 6 is a vertical cross-sectional view of a multilayer substrate 101 according to the first modified example.

The multilayer substrate 101 according to the first modified example is different from the multilayer substrate 100 according to the first example embodiment in that the first ground conductor 36 and the second ground conductor 38 are not provided.

The multilayer substrate 101 has a structure in which the multilayer body 10 is laminated with the protective films 11*a* and 11*b* in the thickness direction T. Specifically, the first main surface 10*a* of the multilayer body 10 is laminated with the protective film 11*a*, and the second main surface 10*b* of the multilayer body 10 is laminated with the protective film 11*b*.

Even in the above configuration, variations in the clearance between the plurality of conductors 30 can be reduced or prevented, as in the multilayer substrate 100 according to the first example embodiment.

Second Modified Example

Hereinafter, a multilayer substrate according to a second modified example of the first example embodiment will be described with reference to the accompanying drawings.

Figure 7:
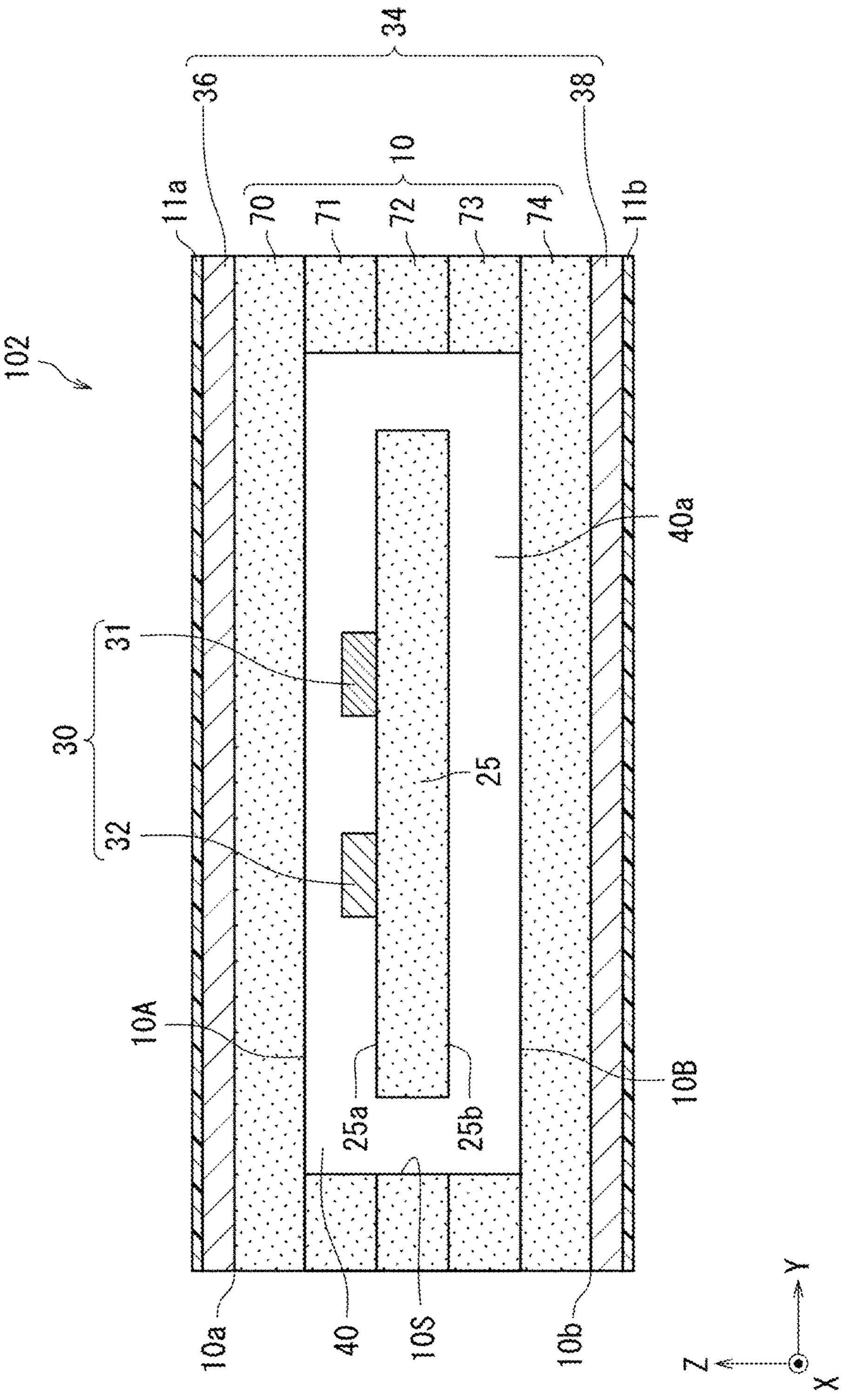
FIG. 7 is a vertical cross-sectional view of a multilayer substrate according to a second modified example of an example embodiment of the present invention.

FIG. 7 is a vertical cross-sectional view of a multilayer substrate 102 according to the second modified example.

The multilayer substrate 102 according to the second modified example is different from the multilayer substrate 100 according to the first example embodiment in configurations of the plurality of conductors 30.

As illustrated in FIG. 7, the plurality of conductors 30 include one signal conductor 31 and one inner layer ground conductor 32.

Even in the above configuration, variations in the clearance between the plurality of conductors 30 can be reduced or prevented, as in the multilayer substrate 100 according to the first example embodiment.

The configurations of the plurality of conductors 30 are not limited to the configurations of the first example embodiment and the second modified example. The plurality of conductors 30 may have any configuration of a combination in which advantageous characteristics are affected by the clearance between the plurality of conductors 30.

For example, the plurality of conductors 30 may include two signal conductors 31 that define a differential line. Two inner layer ground conductors 32 may be disposed at positions between which the differential line is interposed.

Second Example Embodiment

Hereinafter, a multilayer substrate according to a second example embodiment of the present invention will be described with reference to the accompanying drawings.

Figure 8:
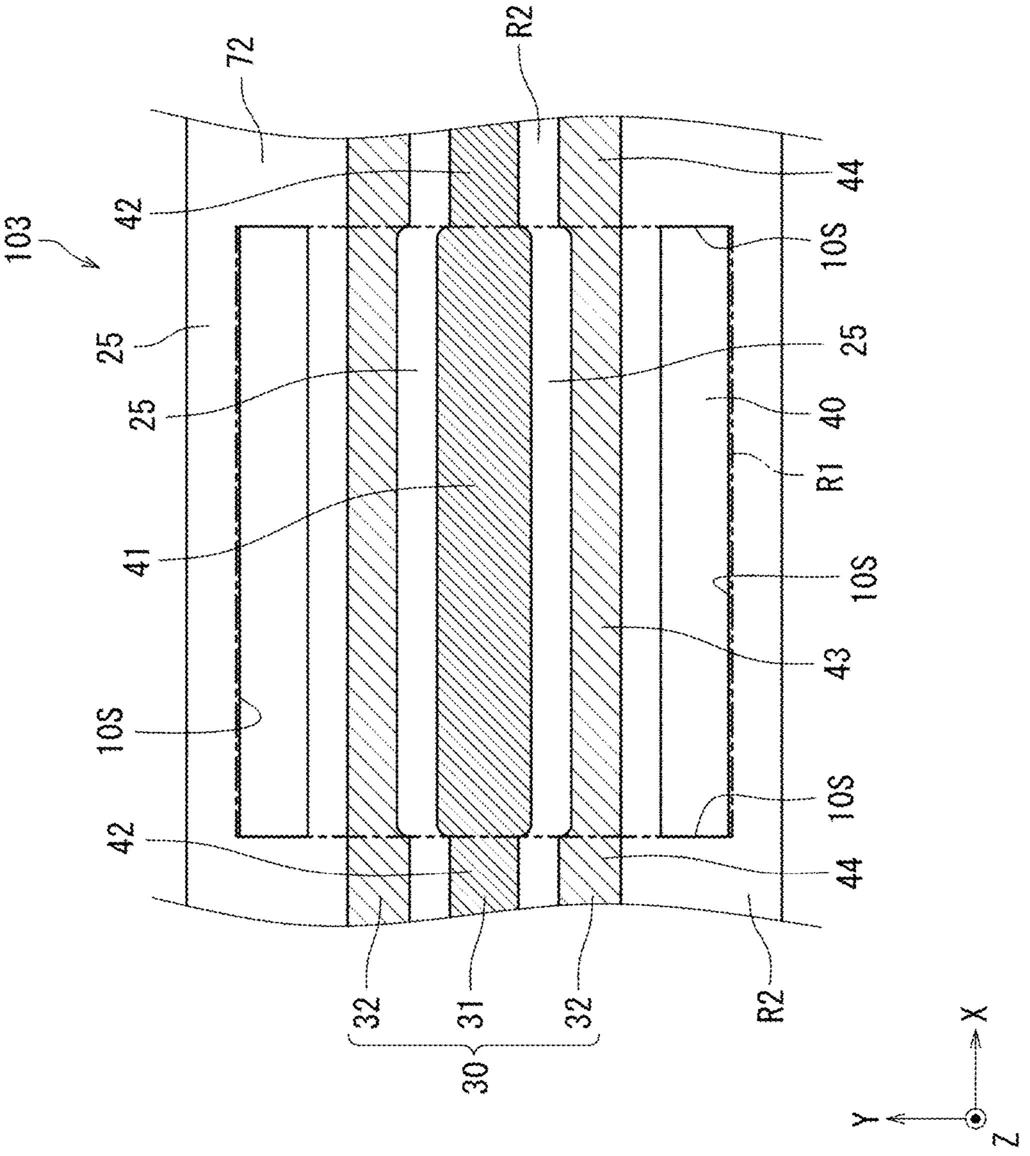
FIG. 8 is a partial enlarged view of a multilayer substrate according to a second example embodiment of the present invention.

FIG. 8 is a partial enlarged view of a multilayer substrate 103 according to the second example embodiment. FIG. 8 illustrates an enlarged view of a portion of the first inner layer resin 25 on which the plurality of conductors 30 are provided.

The multilayer substrate 103 according to the second example embodiment is different from the multilayer substrate 100 according to the first example embodiment in a width of the signal conductor 31 and widths of the inner layer ground conductors 32.

The signal conductor 31 includes a first portion 41 and second portions 42. In the view in the thickness direction T, a width of the first portion 41 is larger than widths of the second portions 42.

In the multilayer substrate 103, two second portions 42 are connected to both ends of the first portion 41. That is, the first portion 41 is sandwiched between two second portions 42.

The first portion 41 is positioned in the space 40 of the multilayer body 10. Specifically, in the view in the thickness direction T of the multilayer body 10, the first portion 41 is positioned in a first region R1 in which the space 40 is provided in the multilayer body 10. The first region R1 is defined by the inner side walls 10S of the multilayer body 10 in the view in the thickness direction T.

The second portions 42 are not positioned in the space 40 in the multilayer body 10. In the view in the thickness direction T of the multilayer body 10, the second portions 42 are positioned in a second region R2 in which the space 40 is not provided in the multilayer body 10. Specifically, the second region R2 is positioned in an outer side portion of the first region R1 in the view in the thickness direction T and is a region in which the plastic resin layer 72 is disposed. The second region R2 is disposed in the outer side portion of the first region R1 in the substrate extending direction S in the view in the thickness direction T. Thus, in the view in the thickness direction T, the second portions 42 extend from the inside of the multilayer body 10 to the space 40 and are connected to the first portion 41.

For example, the width of the first portion 41 is about 1.1 times or more and about 3.0 times or less the widths of the second portions 42. A maximum dimension of the first portion 41 in the width direction W in the view in the thickness direction T can be used as the width of the first portion 41. Minimum dimensions of the second portions 42 in the width direction W in the view in the thickness direction T can be used as the widths of the second portions 42.

According to such a configuration, impedance matching of the signal conductor 31 is easily performed. In the first portion 41 positioned in the space 40 including air having a low dielectric constant, a change in impedance is unlikely to occur by setting the width of the signal conductor 31 to be larger than the widths of the second portions 42.

In the multilayer substrate 103, the inner layer ground conductors 32 include third portions 43 and fourth portions 44 having larger widths than the third portions 43. In the multilayer substrate 103, two fourth portions 44 are connected to both ends of each third portion 43. That is, each third portion 43 is sandwiched between two fourth portions 44.

The third portions 43 are positioned in the space 40 in the multilayer body 10. Similar to the first portion 41, the third portions 43 are positioned in the first region R1 in the view in the thickness direction T of the multilayer body 10.

The fourth portions 44 are not positioned in the space 40 in the multilayer body 10. Similar to the second portions 42, the fourth portions 44 are positioned in the second region R2 in the view in the thickness direction T of the multilayer body 10. Thus, in the view in the thickness direction T, the fourth portions 44 extend from the inside of the multilayer body 10 to the space 40 and are connected to the third portions 43.

According to such a configuration, in the view in the thickness direction T, a constant clearance between the signal conductor 31 and the inner layer ground conductors 32 is easily provided. Accordingly, since a difference in the clearance between the plurality of conductors 30 is unlikely to occur, impedance matching of the signal conductor 31 is easily performed.

Adjusting the widths of the inner layer ground conductors 32 in accordance with the width of the signal conductor 31 can reduce a space for the plurality of conductors 30. Accordingly, size reduction of the multilayer substrate 103 can be provided.

In the view in the thickness direction T, widths of the fourth portions 44 of the inner layer ground conductors 32 may be larger than the widths of the second portions 42 of the signal conductor 31. The widths of the second portions 42 and the widths of the fourth portions 44 mean dimensions in the width direction W in the view in the thickness direction T.

While an example in which the widths of the inner layer ground conductors 32 vary has been described in the present example embodiment, the present invention is not limited to this. The widths of the inner layer ground conductors 32 may be constant.

Third Example Embodiment

Hereinafter, a multilayer substrate according to a third example embodiment of the present invention will be described with reference to the accompanying drawings.

Figure 9:
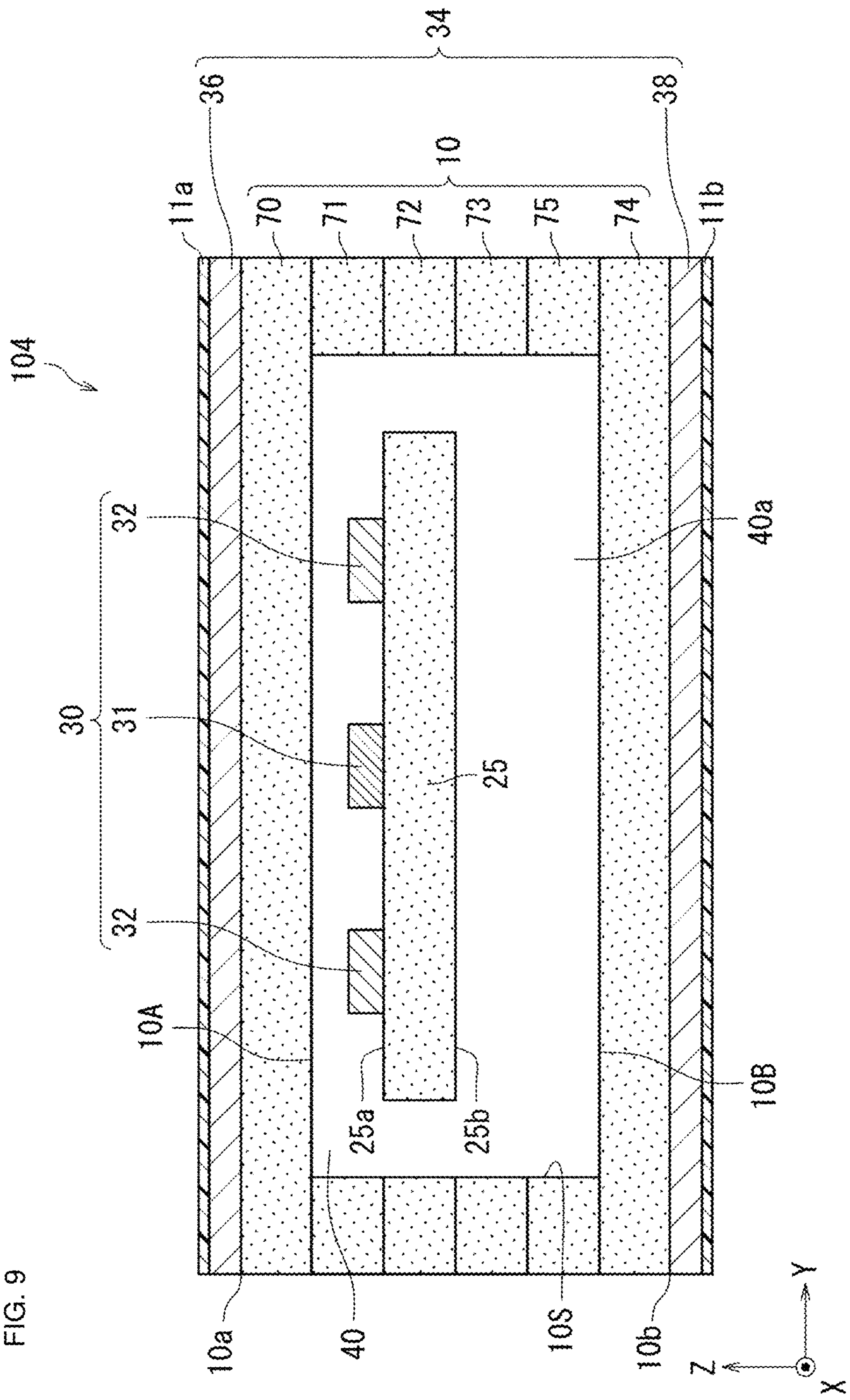
FIG. 9 is a vertical cross-sectional view of a multilayer substrate according to a third example embodiment of the present invention.

FIG. 9 is a vertical cross-sectional view of a multilayer substrate 104 according to the third example embodiment.

The multilayer substrate 104 according to the third example embodiment is different from the multilayer substrate 100 according to the first example embodiment in a configuration of the multilayer body 10 and a position of the first inner layer resin 25.

As illustrated in FIG. 9, the multilayer body 10 further includes a plastic resin layer 75. The plastic resin layer 75 is disposed between the plastic resin layers 73 and 74. The plastic resin layer 75 has, for example, the same or substantially the same shape as the plastic resin layer 73.

The first inner layer resin 25 is not present at a center of the multilayer substrate 104 in the thickness direction T of the multilayer substrate 104. The first inner layer resin 25 is disposed at a position closer to the plastic resin layer 70 than the plastic resin layer 74. Specifically, the first inner layer resin 25 is disposed at a position closer to the first main surface 10*a* than the second main surface 10*b* of the multilayer body 10 in the thickness direction T. In other words, in the thickness direction T, an interval between the first inner wall 10A of the multilayer body 10 and the third main surface 25*a* of the first inner layer resin 25 is smaller than an interval between the second inner wall 10B of the multilayer body 10 and the fourth main surface 25*b* of the first inner layer resin 25.

Bending stress of the first inner layer resin 25 depends on a distance from a bending neutral axis. In a case where the first inner layer resin 25 is bent, compressive stress is generated on an inner peripheral side of a bent portion, and tensile stress is generated on an outer peripheral side of the bent portion. The compressive stress and the tensile stress are reduced toward an internal center in the thickness direction of the first inner layer resin 25, and there is a position at which the compressive stress and the tensile stress are zero or substantially zero. This position is referred to as the bending neutral axis. In a case where the distance from the bending neutral axis is zero or substantially zero, the bending stress is zero or substantially zero. The bending stress is increased as the distance is increased. Since the first inner layer resin 25 is separated from the multilayer body 10 in the space 40, the bending stress can be reduced even at a position separated from the bending neutral axis.

Accordingly, even in a configuration such as the multilayer substrate 104, variations in the clearance between the plurality of conductors 30 can be effectively reduced or prevented.

While an example in which the first inner layer resin 25 is caused not to be present at the center in the thickness direction T by adding one plastic resin layer 75 to the multilayer body 10 has been described in the present example embodiment, the present invention is not limited to this. For example, the first inner layer resin 25 may be caused not to be present at the center in the thickness direction T by increasing a thickness of the plastic resin layer 73. The first inner layer resin 25 may also be caused not to be present at the center in the thickness direction T by adding one or more plastic resin layers 75.

While an example in which the plastic resin layer 75 has the same or substantially the same shape as the plastic resin layer 73 has been described in the present example embodiment, the present invention is not limited to this. For example, the plastic resin layer 75 may have a different shape and a different thickness from the plastic resin layer 73.

While an example in which the first inner layer resin 25 is disposed at a position closer to the plastic resin layer 70 than the plastic resin layer 74 in the thickness direction T has been described in the present example embodiment, the present invention is not limited to this. For example, the first inner layer resin 25 may be disposed at a position closer to the plastic resin layer 74 than the plastic resin layer 70 in the thickness direction T.

Fourth Example Embodiment

Hereinafter, a multilayer substrate according to a fourth example embodiment of the present invention will be described with reference to the accompanying drawings.

Figure 10:
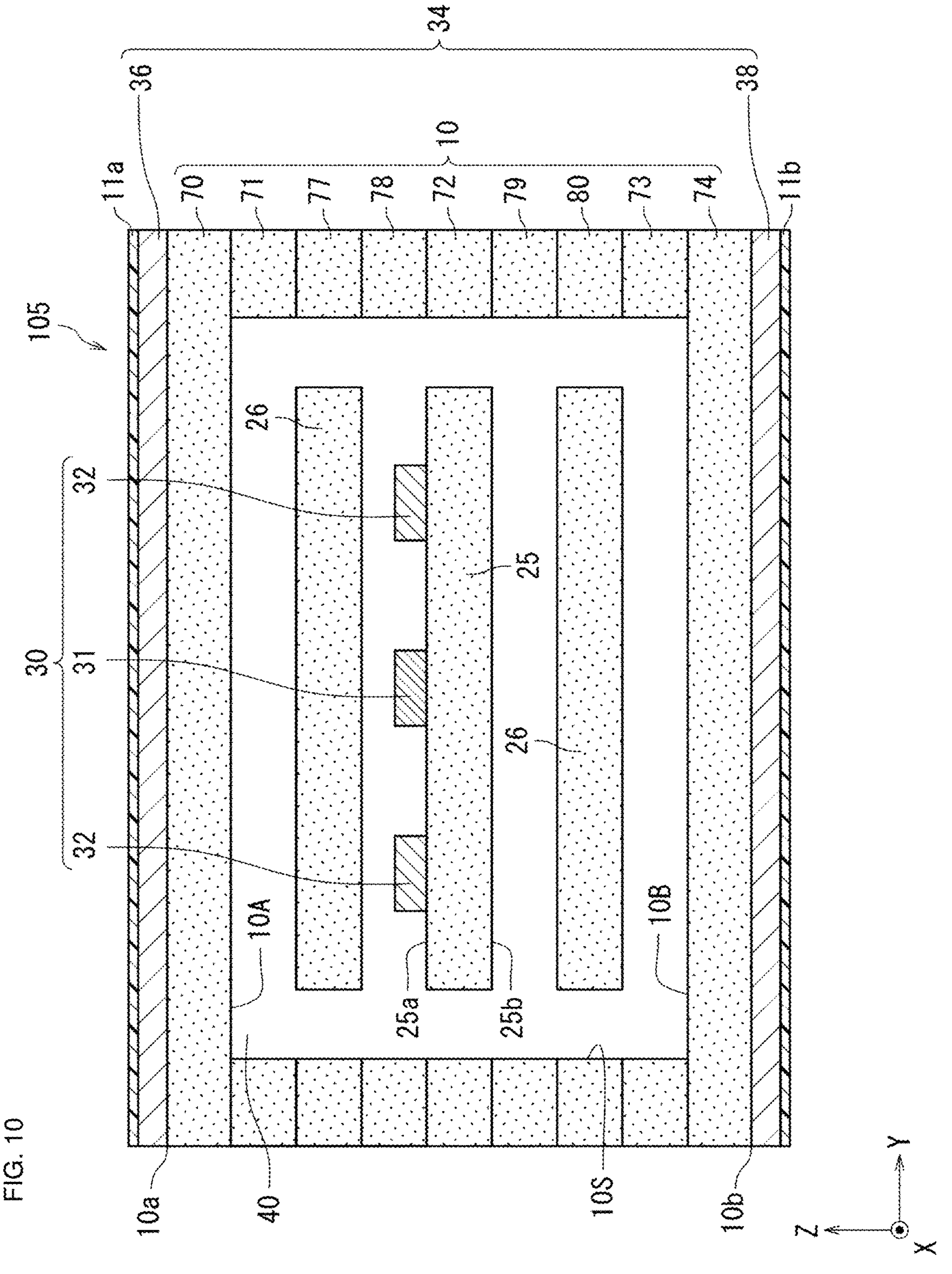
FIG. 10 is a vertical cross-sectional view of a multilayer substrate according to a fourth example embodiment of the present invention.

FIG. 10 is a vertical cross-sectional view of a multilayer substrate 105 according to the fourth example embodiment.

The multilayer substrate 105 according to the fourth example embodiment is different from the multilayer substrate 100 according to the first example embodiment in that a plurality of second inner layer resins 26 are further provided in addition to the configuration of the multilayer body 10.

As illustrated in FIG. 10, the multilayer body 10 further includes plastic resin layers 77, 78, 79, and 80. The plastic resin layers 77 and 78 are disposed between the plastic resin layers 71 and 72. The plastic resin layers 79 and 80 are disposed between the plastic resin layers 72 and 73. The plastic resin layers 77 and 80 have, for example, the same or substantially the same shape as the plastic resin layer 72. The plastic resin layers 78 and 79 have, for example, the same or substantially the same shape as the plastic resin layer 71.

The multilayer substrate 105 further includes the plurality of second inner layer resins 26. The plurality of second inner layer resins 26 have, for example, the same or substantially the same shape as the first inner layer resin 25. The plurality of second inner layer resins 26 are disposed in the space 40 of the multilayer body 10. Specifically, in the space 40 of the multilayer body 10, the plurality of second inner layer resins 26 are disposed at intervals in the thickness direction T of the multilayer body 10. The first inner layer resin 25 is disposed between the plurality of second inner layer resins 26 in the thickness direction T. More specifically, the plurality of second inner layer resins 26 are disposed between the third main surface **25*a* of the first inner layer resin 25 and the first inner wall 10A of the multilayer body 10, and between the fourth main surface 25*b* of the first inner layer resin 25 and the second inner wall 10B of the multilayer body 10**.

In the present example embodiment, the plurality of second inner layer resins 26 are integrally provided with the plastic resin layers 77 and 80, respectively. Thus, the plurality of second inner layer resins 26 are made of the same resin as the plastic resin layers 77 and 80. In other words, the plurality of second inner layer resins 26 are provided as a portion of the multilayer body 10.

The plurality of second inner layer resins 26 are connected to the multilayer body 10 in the substrate extending direction S of the multilayer substrate 100. Specifically, the plurality of second inner layer resins 26 are separated from the first inner wall 10A and the second inner wall 10B in the thickness direction T. The plurality of second inner layer resins 26 are separated from the inner side wall 10S in the width direction W and are connected to the inner side wall 10S in the substrate extending direction S.

According to such a configuration, since the multilayer substrate 105 includes the plurality of second inner layer resins 26, a case where the first inner layer resin 25 and the plurality of conductors 30 approach the first ground conductor 36 and the second ground conductor 38 is reduced or prevented. For example, in a case where the multilayer substrate 105 deforms, the first inner layer resin 25 comes into contact with the second inner layer resins 26. Thus, a decrease in distances between the plurality of conductors 30 and the first ground conductor 36 and the second ground conductor 38 can be reduced or prevented. Accordingly, variations in impedance of the plurality of conductors 30 can be reduced or prevented.

While an example in which the multilayer substrate 105 includes the plurality of second inner layer resins 26 has been described in the present example embodiment, the present invention is not limited to this. The multilayer substrate 105 may include one or more second inner layer resins 26. For example, in a case where the multilayer substrate 105 includes one second inner layer resin 26, the second inner layer resin 26 may be disposed in the space 40 on a mountain fold side with reference to the first inner layer resin 25 in a case where the multilayer substrate 105 is bent.

Fifth Example Embodiment

Hereinafter, a multilayer substrate according to a fifth example embodiment of the present invention will be described with reference to the accompanying drawings.

Figure 11A:
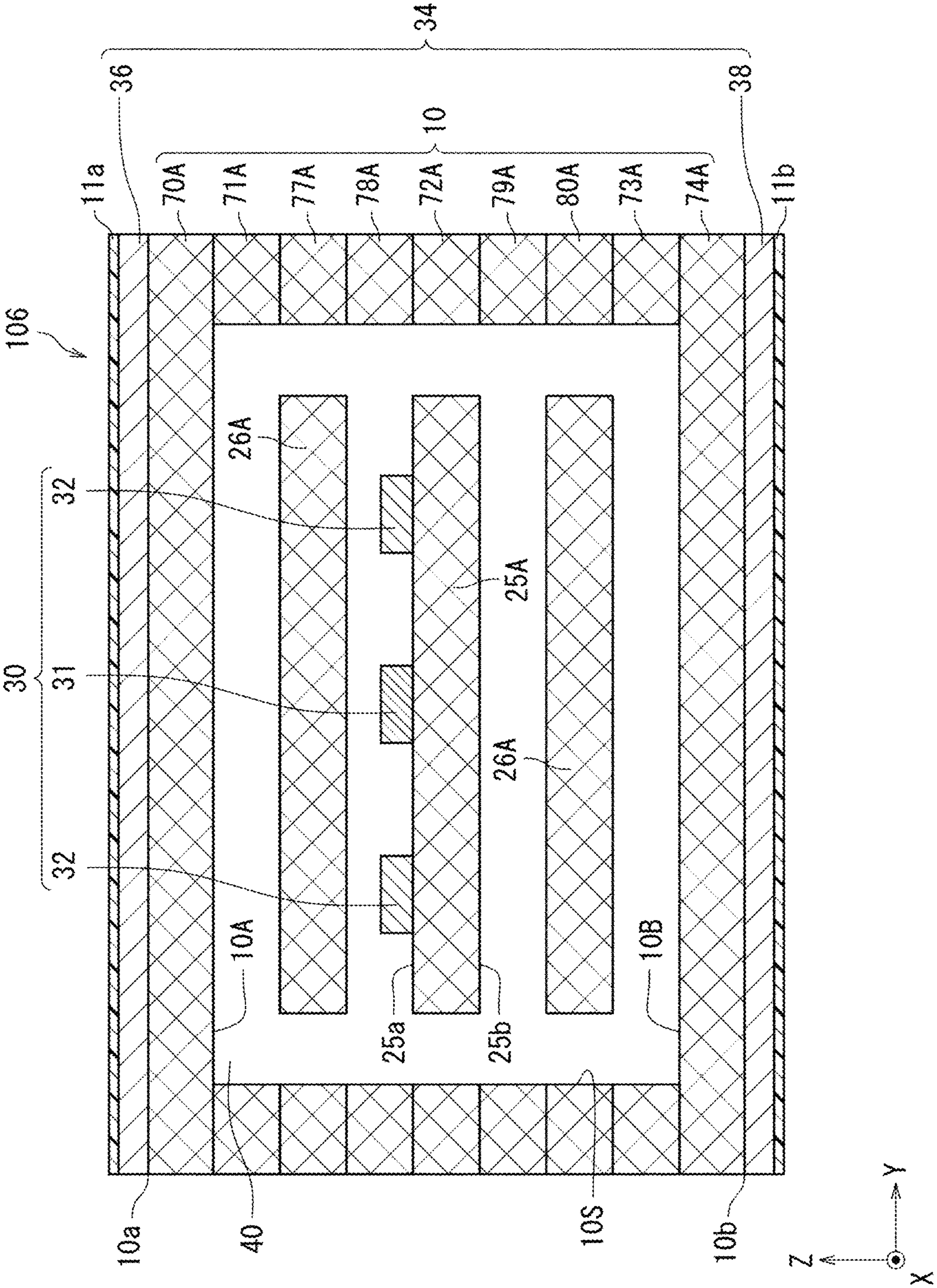
FIG. 11A is a vertical cross-sectional view of a multilayer substrate according to a fifth example embodiment of the present invention.
Figure 11B:
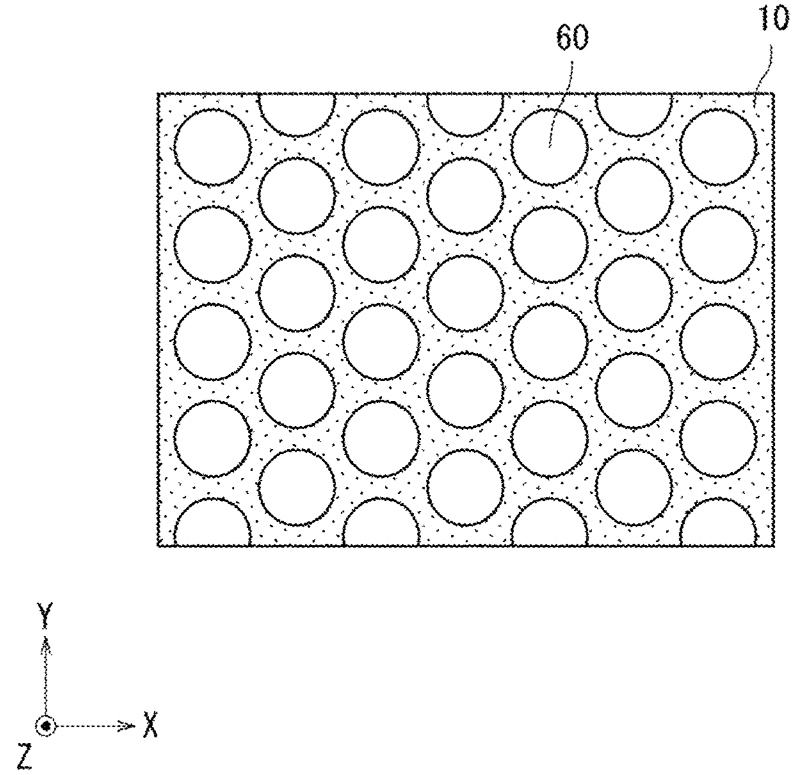
FIG. 11B is a partial enlarged view illustrating an example of a plurality of first through-holes provided in a multilayer body.

FIG. 11A is a vertical cross-sectional view of a multilayer substrate 106 according to the fifth example embodiment. FIG. 11B is a partial enlarged view illustrating an example of a plurality of first through-holes 60 provided in the multilayer body 10.

The multilayer substrate 106 according to the fifth example embodiment is different from the multilayer substrate 105 according to the fourth example embodiment in structures of plastic resin layers 70A to 78A, a first inner layer resin 25A, and second inner layer resins 26A.

As illustrated in FIGS. 11A and 11B, in the multilayer substrate 106, the plurality of first through-holes 60 are provided throughout the multilayer body 10, the first inner layer resin 25A, and the second inner layer resins 26A.

The multilayer body 10 includes the plastic resin layers 70A to 74A and plastic resin layers 77A to 80A.

For example, the plastic resin layers 70A to 74A and the plastic resin layers 77A to 80A have the same or substantially the same shape as the plastic resin layers 70 to 74 and the plastic resin layers 77 to 80, respectively, except that the plurality of first through-holes 60 are provided.

As illustrated in FIG. 11B, the plurality of first through-holes 60 are holes that are regularly provided. Specifically, the plurality of first through-holes 60 have the same or substantially the same shapes and the same or substantially the same sizes and are provided at an equal or substantially equal interval. For example, the plurality of first through-holes 60 are provided in a matrix in the view in the thickness direction T.

The shapes of the plurality of first through-holes 60 are, for example, circular or substantially circular shapes in the view in the thickness direction T. The plurality of first through-holes 60 have, for example, cavity widths of, for example, about 81 μm or more and about 500 μm or less. In the present specification, the "cavity width" is a maximum dimension of the first through-holes 60. In the present example embodiment, the cavity width means a maximum diameter of the first through-holes 60 in the view in the thickness direction T. The interval between the plurality of first through-holes 60 is, for example, about 73 μm or more and about 730 μm or less.

Each of the plastic resin layers 70A to 74A, the plastic resin layers 77A to 80A, the first inner layer resin 25A, and the second inner layer resins 26A is configured with, for example, a mesh member.

The plurality of first through-holes 60 are provided using, for example, a laser.

The plurality of first through-holes 60 are not holes of interlayer connection conductors such as via conductors. Thus, air is present in the first through-holes 60.

According to such a configuration, variations in the clearance between the plurality of conductors 30 can be reduced or prevented while plasticity of the multilayer substrate 106 is improved.

More specifically, an amount of resin in the multilayer substrate 106 is reduced by providing the plurality of first through-holes 60 throughout the multilayer body 10, the first inner layer resin 25A, and the second inner layer resins 26A. Accordingly, the multilayer substrate 106 is easily bent or folded, and usability is improved.

While an example in which the plurality of first through-holes 60 are provided throughout the multilayer body 10, the first inner layer resin 25A, and the second inner layer resins 26A has been described in the present example embodiment, the present invention is not limited to this. The plurality of first through-holes 60 may be provided in at least a portion of the multilayer body 10, the first inner layer resin 25A, or the second inner layer resins 26A.

For example, it is possible that the plurality of first through-holes 60 are provided in a portion of the plastic resin layers 70A and 74A of the multilayer body 10, and the plurality of first through-holes 60 are not provided in other portions.

For example, the plurality of first through-holes 60 may be provided in a portion of the first inner layer resin 25A or the second inner layer resins 26A. In the first inner layer resin 25A or the second inner layer resins 26A, the plurality of first through-holes 60 may be provided at positions overlapping with the signal conductor 31 in the view in the thickness direction T of the multilayer body 10. Accordingly, a dielectric constant and a dissipation factor around the signal conductor 31 are reduced, and electrical characteristics are improved.

The shapes of the plurality of first through-holes 60 are not limited and may be, for example, triangular or substantially triangular pyramid shapes. The shapes in the view in the thickness direction T are also not limited and may be, for example, elliptical or substantially elliptical shapes.

The present invention is not limited to the plurality of first through-holes 60 provided throughout the plastic resin layers 70A to 74A, the plastic resin layers 77A to 80A, the first inner layer resin 25A, and the second inner layer resins 26A. The present invention is also not limited to the plurality of first through-holes 60 provided in each of the plastic resin layers 70A to 74A, the plastic resin layers 77A to 80A, the first inner layer resin 25A, and the second inner layer resins 26A.

It is possible that the plurality of first through-holes 60 are not regularly arranged. For example, the plurality of first through-holes 60 may be randomly provided. The sizes or the shapes of the plurality of first through-holes 60 may vary.

In the multilayer substrate 106, the second inner layer resins 26A are not essential configurations.

Modified Example

Hereinafter, a multilayer substrate according to a modified example of the fifth example embodiment will be described with reference to FIG. 11C.

Figure 11C:
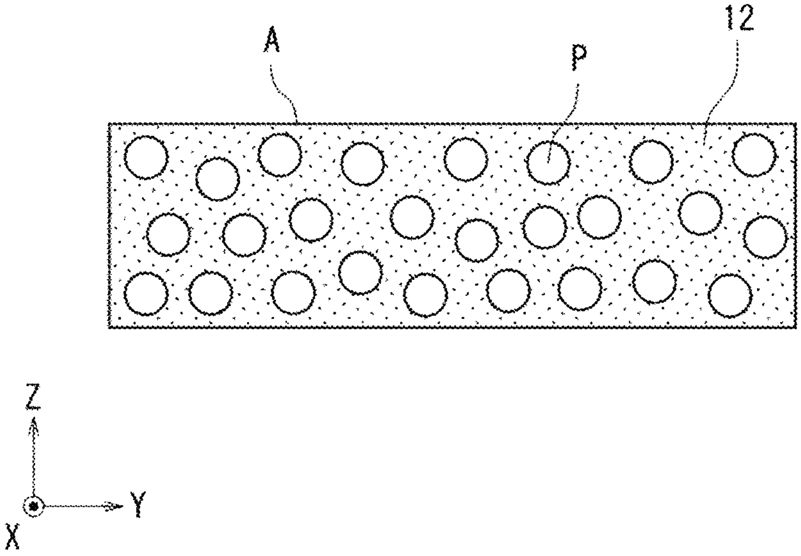
FIG. 11C is a partial enlarged cross-sectional view illustrating an example of a porous material.

FIG. 11C is a partial enlarged cross-sectional view illustrating an example of a porous material.

The multilayer substrate according to the modified example of the fifth example embodiment is different from the multilayer substrate 106 according to the fifth example embodiment in that the multilayer body 10, the first inner layer resin 25A, and the second inner layer resins 26A are made of the porous material.

As illustrated in FIG. 11C, the porous material is a material having a porous structure. The porous structure is a structure in which a plurality of air bubbles P are dispersed throughout a porous region A. The porous region A means a region in which the plurality of air bubbles P are provided in a body 12 constituting the porous material. The porous region A is provided throughout the multilayer body 10, the first inner layer resin 25A, and the second inner layer resins 26A.

The porous region A includes a plurality of independent air bubbles. The independent air bubbles have a structure in which air in the air bubbles P cannot leak outside the body 12 because all air bubbles P are surrounded by the material of the body 12. In the independent air bubbles, adjacent air bubbles P are not connected to each other. A porosity of the porous region A is, for example, about 30% or more and about 80% or less. The porosity is a ratio of volumes of the air bubbles P to a volume of the entire body 12.

Even in such a configuration, the same advantageous effects as the multilayer substrate 106 according to the fifth example embodiment can be achieved.

While an example in which all of the multilayer body 10, the first inner layer resin 25A, and the second inner layer resins 26A are made of the porous material has been described, the present invention is not limited to this. For example, at least a portion of the multilayer body 10, the first inner layer resin 25A, or the second inner layer resins 26A may be made of the porous material. The porous region A may be provided in at least a portion of the multilayer body 10, the first inner layer resin 25A, or the second inner layer resins 26A.

While an example in which the porous material is structured to include a plurality of independent air bubbles has been described in the modified example of the fifth example embodiment, the present invention is not limited to this.

Figure 11D:
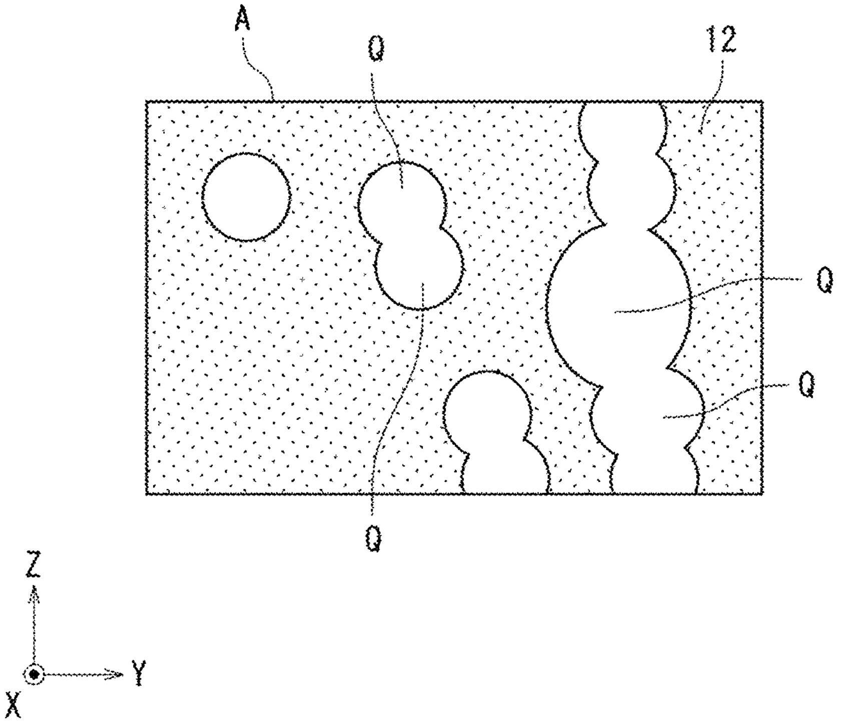
FIG. 11D is a partial enlarged cross-sectional view illustrating another example of the porous material.

FIG. 11D is a partial enlarged cross-sectional view illustrating another example of the porous material. As illustrated in FIG. 11D, a plurality of air bubbles Q may be provided to be connected to each other in the porous material. Shapes and/or sizes of the plurality of air bubbles Q may vary.

Sixth Example Embodiment

Hereinafter, a multilayer substrate according to a sixth example embodiment of the present invention will be described with reference to the accompanying drawings.

Figure 12A:
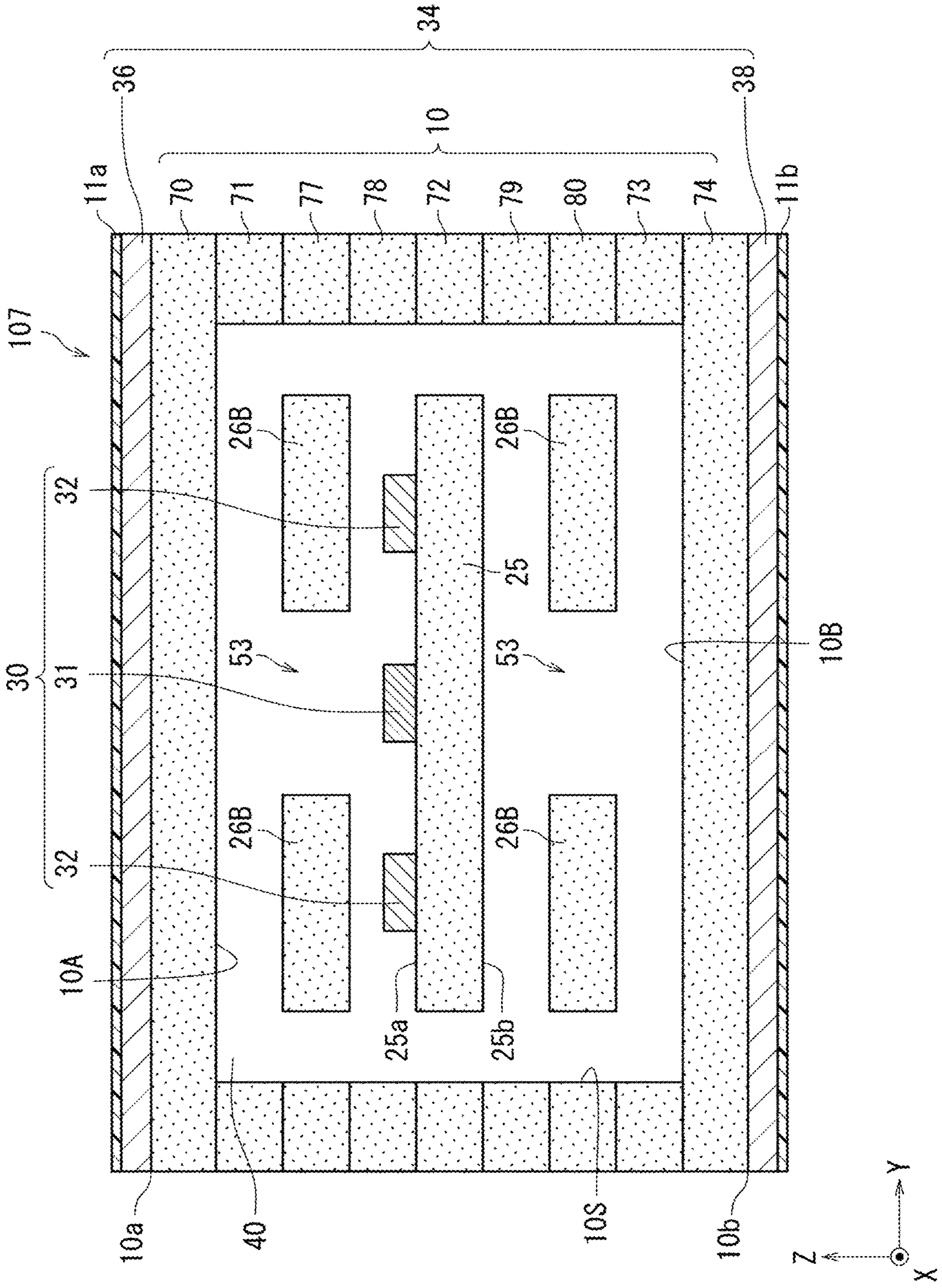
FIG. 12A is a vertical cross-sectional view of a multilayer substrate according to a sixth example embodiment of the present invention.
Figure 12B:
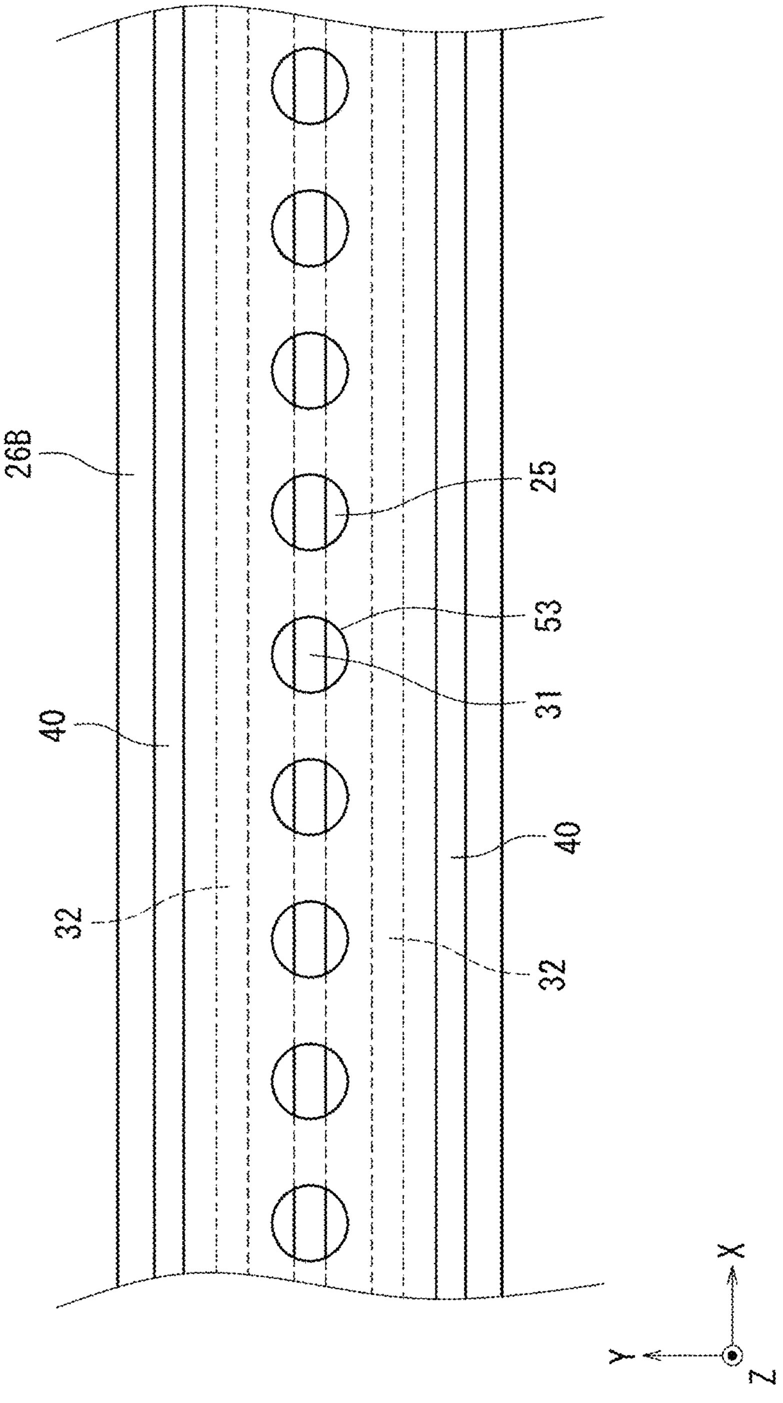
FIG. 12B is a partial enlarged view illustrating an example of a plurality of second through-holes provided in a second inner layer resin.

FIG. 12A is a vertical cross-sectional view of a multilayer substrate 107 according to the sixth example embodiment. FIG. 12B is a partial enlarged view illustrating an example of a plurality of second through-holes 53 provided in second inner layer resins 26B.

The multilayer substrate 107 according to the sixth example embodiment is different from the multilayer substrate 105 according to the fourth example embodiment in structures of the second inner layer resins 26B.

As illustrated in FIGS. 12A and 12B, in the multilayer substrate 107, the plurality of second through-holes 53 are provided in the second inner layer resins 26B. In the present example embodiment, the plurality of second through-holes 53 are provided in each of two second inner layer resins 26B.

As illustrated in FIG. 12B, the plurality of second through-holes 53 are provided at positions overlapping with the signal conductor 31 in the view in the thickness direction T. The plurality of second through-holes 53 are provided along a direction in which the signal conductor 31 extends, that is, the substrate extending direction S, in the view in the thickness direction T.

The plurality of second through-holes 53 have, for example, circular or substantially circular shapes in the view in the thickness direction T. In the multilayer substrate 107, lengths of the second through-holes 53 in the width direction W are larger than a length of the signal conductor 31 in the width direction W. The second through-holes 53 have, for example, cavity widths of about ⅙ or more and about ⅓ or less of a length of the multilayer body 10 in the width direction W. The “cavity width” is a maximum dimension of the second through-holes 53 in the width direction W of the multilayer body 10. In the present example embodiment, the cavity width means a maximum diameter of the second through-holes 53.

Similar to the space 40, air is present in the plurality of second through-holes 53 provided in the second inner layer resins 26B.

According to such a configuration, providing the plurality of second through-holes 53 in the second inner layer resins 26B can reduce a portion in which the second inner layer resins 26B are disposed in a region overlapping with the signal conductor 31 in the view in the thickness direction T. Air having a lower dielectric constant than the second inner layer resins 26B is present in the plurality of second through-holes 53. Thus, signal characteristics of the signal conductor 31 can be improved.

The lengths of the second through-holes 53 in the width direction W are larger than the length of the signal conductor 31 in the width direction W. This configuration can further improve the signal characteristics of the signal conductor 31.

While an example in which the multilayer substrate 107 includes two second inner layer resins 26B has been described in the present example embodiment, the present invention is not limited to this. For example, the multilayer substrate 107 may include one or more second inner layer resins 26B.

While an example in which the plurality of second through-holes 53 are provided in the second inner layer resins 26B has been described in the present example embodiment, the present invention is not limited to this. For example, one or more second through-holes 53 may be provided in the second inner layer resins 26B. For example, one second through-hole 53 having a rectangular shape may be provided in the second inner layer resins 26B.

While an example in which the plurality of second through-holes 53 are provided in both of two second inner layer resins 26B has been described in the present example embodiment, the present invention is not limited to this. For example, the plurality of second through-holes 53 may be provided in at least one of two second inner layer resins 26B.

Shapes of the second through-holes 53 are not limited and may be, for example, triangular or substantially triangular pyramid shapes. The shapes of the second through-holes 53 in the view in the thickness direction T are also not limited and may be, for example, elliptical or substantially shapes, rectangular or substantially rectangular shapes, or polygonal or substantially polygonal shapes.

Seventh Example Embodiment

Hereinafter, a multilayer substrate according to a seventh example embodiment of the present invention will be described with reference to the accompanying drawings.

Figure 13A:
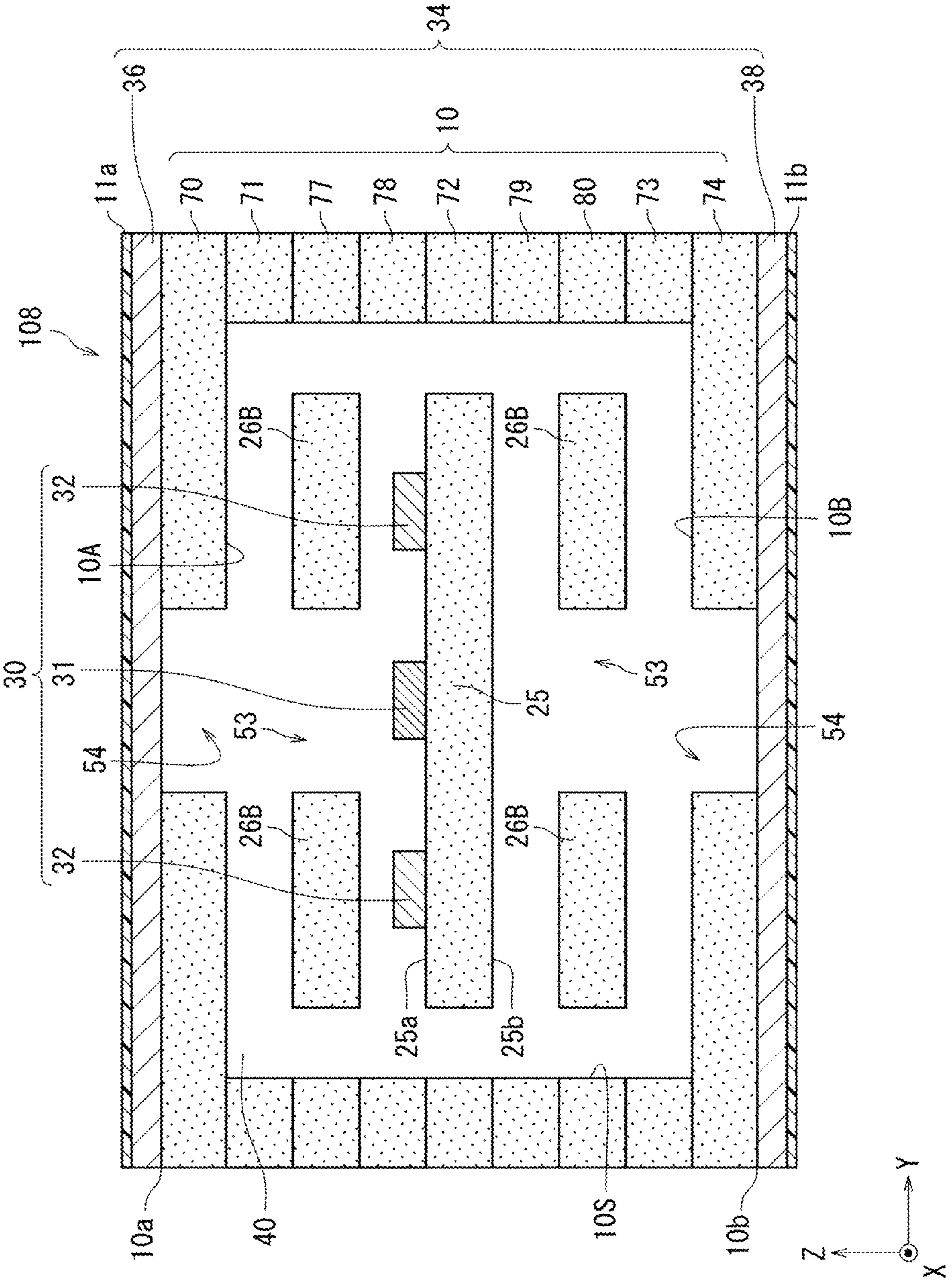
FIG. 13A is a vertical cross-sectional view of a multilayer substrate according to a seventh example embodiment of the present invention.
Figure 13B:
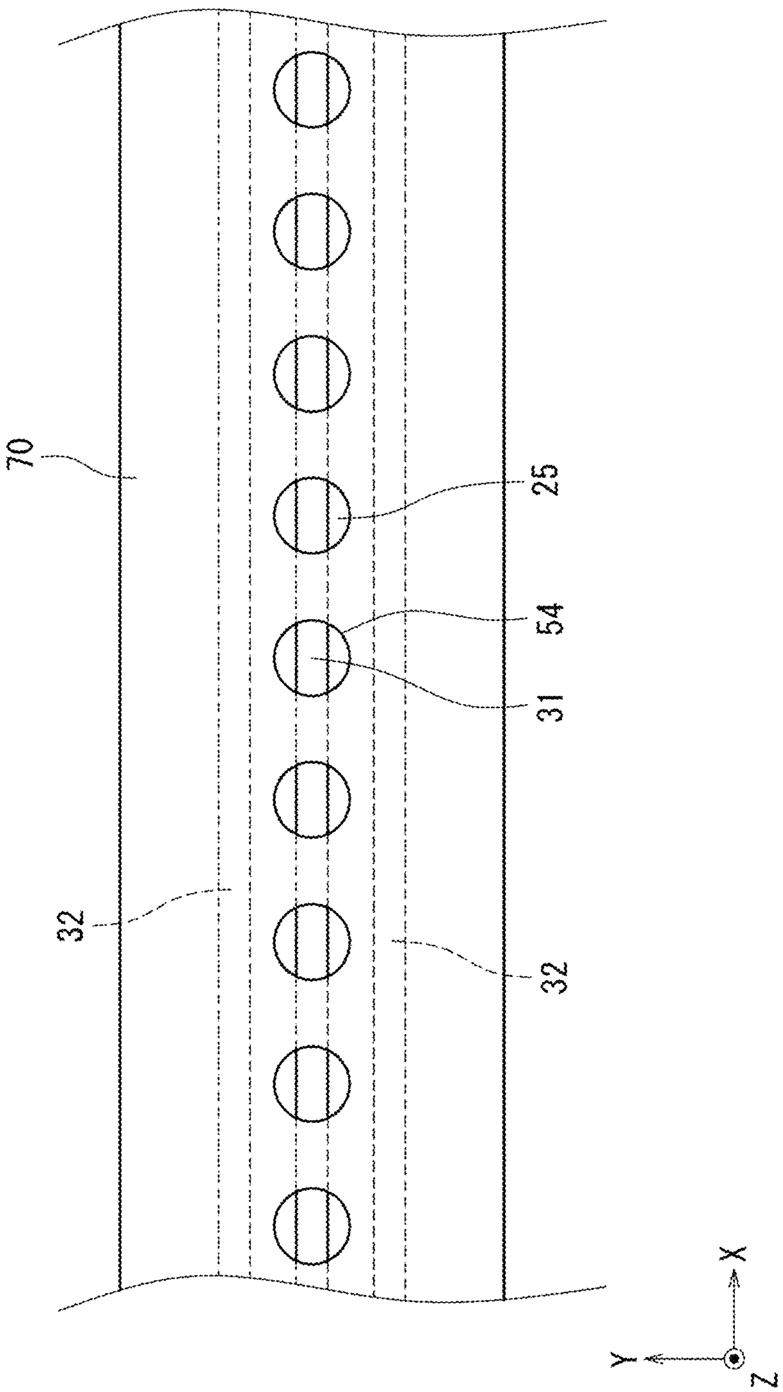
FIG. 13B is a partial enlarged view illustrating an example of a plurality of third through-holes provided in a plastic resin layer.

FIG. 13A is a vertical cross-sectional view of a multilayer substrate 108 according to the seventh example embodiment. FIG. 13B is a partial enlarged view illustrating an example of a plurality of third through-holes 54 provided in the plastic resin layer 70.

The multilayer substrate 108 according to the seventh example embodiment is different from the multilayer substrate 107 according to the sixth example embodiment in a structure of the multilayer body 10.

As illustrated in FIGS. 13A and 13B, the plurality of third through-holes 54 are further provided in the plastic resin layers 70 and 74.

As illustrated in FIG. 13B, the plurality of third through-holes 54 are provided at positions overlapping with the signal conductor 31 in the view in the thickness direction T. The plurality of third through-holes 54 are provided along the direction in which the signal conductor 31 extends, that is, the substrate extending direction S, in the view in the thickness direction T.

The plurality of third through-holes 54 have, for example, circular or substantially circular shapes in the view in the thickness direction T. In the multilayer substrate 108, lengths of the through-holes 54 in the width direction W are larger than the length of the signal conductor 31 in the width direction W. The third through-holes 54 have, for example, cavity widths of about ⅙ or more and about ⅓ or less of the length of the multilayer body 10 in the width direction W. The “cavity width” is a maximum dimension of the third through-holes 54 in the width direction W of the multilayer body 10. In the present example embodiment, the cavity width means a maximum diameter of the third through-holes 54.

In the present example embodiment, the plurality of third through-holes 54 are provided at positions overlapping with the plurality of through-holes 53 provided in the second inner layer resins 26B in the view in the thickness direction T. Specifically, the plurality of third through-holes 54 have the same or substantially the same shape, the same or substantially the same dimension, and the same or substantially the same disposition as the plurality of through-holes 53.

Like the space 40, air is present in the plurality of through-holes 54.

According to such a configuration, providing the plurality of third through-holes 54 in the plastic resin layers 70 and 74 can reduce a portion in which the plastic resin layers 70 and 74 are disposed in a region overlapping with the signal conductor 31 in the view in the thickness direction T. Air having a lower dielectric constant than the plastic resin layers 70 and 74 is present in the plurality of third through-holes 54. Thus, the signal characteristics of the signal conductor 31 can be improved in the multilayer substrate 108.

In the view in the thickness direction T, the plurality of third through-holes 54 are provided at positions overlapping with the plurality of through-holes 53 provided in the second inner layer resins 26B. Such a configuration can further improve the signal characteristics of the signal conductor 31.

The lengths of the through-holes 54 in the width direction W are larger than the length of the signal conductor 31 in the width direction W. Accordingly, the signal characteristics of the signal conductor 31 can be improved by reducing the dielectric constant around the signal conductor 31.

While an example in which the plurality of through-holes 54 are provided in the plastic resin layers 70 and 74 has been described in the present example embodiment, the present invention is not limited to this. For example, the plurality of third through-holes 54 may be provided in at least one of the plastic resin layer 70 or 74.

One or more third through-holes 54 may be provided in the plastic resin layer 70 or 74. For example, one third through-hole 54 having a rectangular or substantially rectangular shape may be provided in the plastic resin layer 70 or 74.

The plurality of third through-holes 54 may have different shapes, dimensions, and dispositions from the plurality of through-holes 53.

Shapes of the through-holes 54 are not limited and may be, for example, triangular or substantially triangular pyramid shapes. The shapes of the third through-holes 54 in the view in the thickness direction T are also not limited and may be, for example, elliptical or substantially elliptical shapes, rectangular or substantially rectangular shapes, or polygonal or substantially polygonal shapes.

Eighth Example Embodiment

Hereinafter, a multilayer substrate according to an eighth example embodiment of the present invention will be described with reference to the accompanying drawings.

Figure 14A:
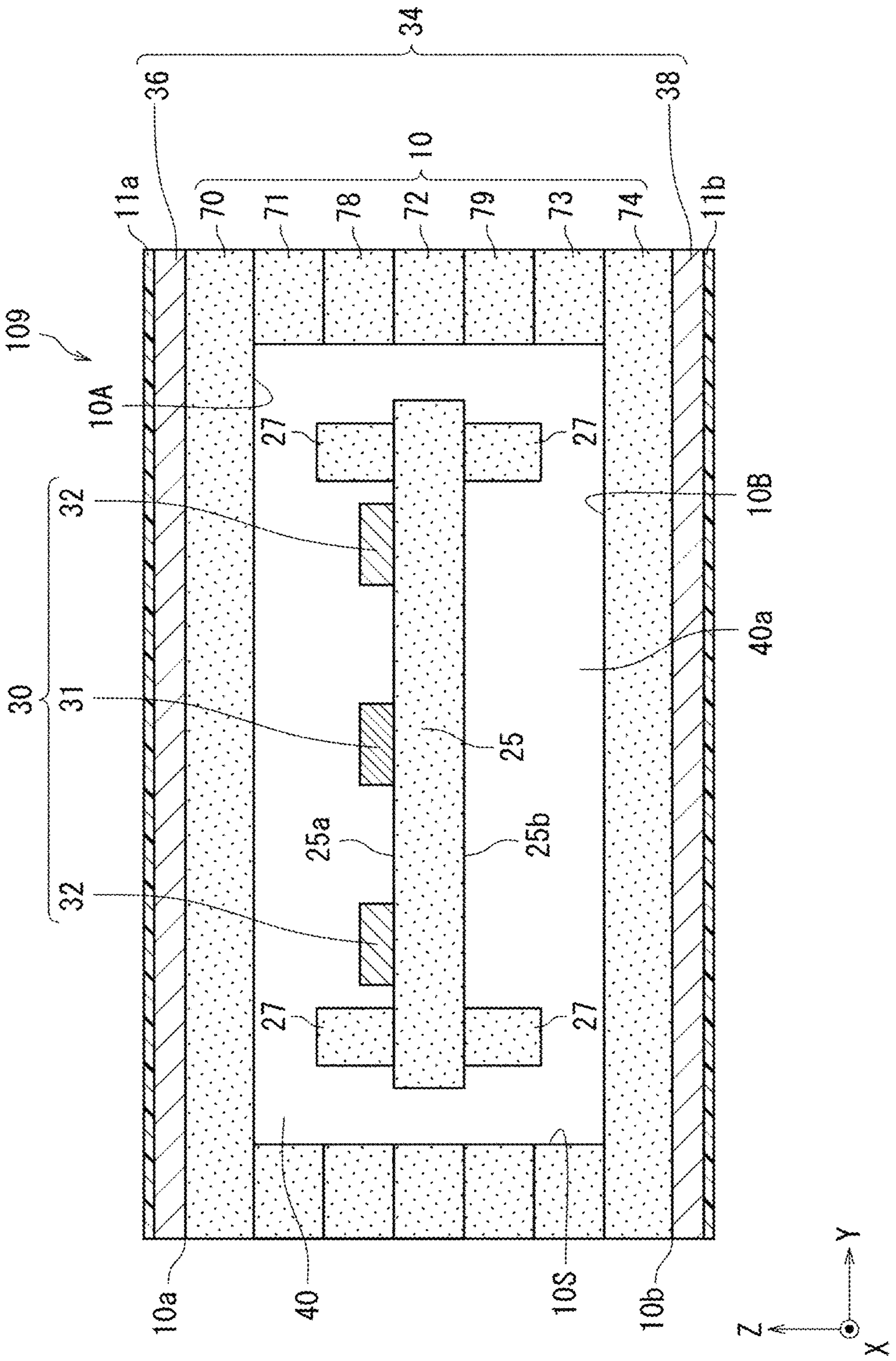
FIG. 14A is a vertical cross-sectional view of a multilayer substrate according to an eighth example embodiment of the present invention.
Figure 14B:
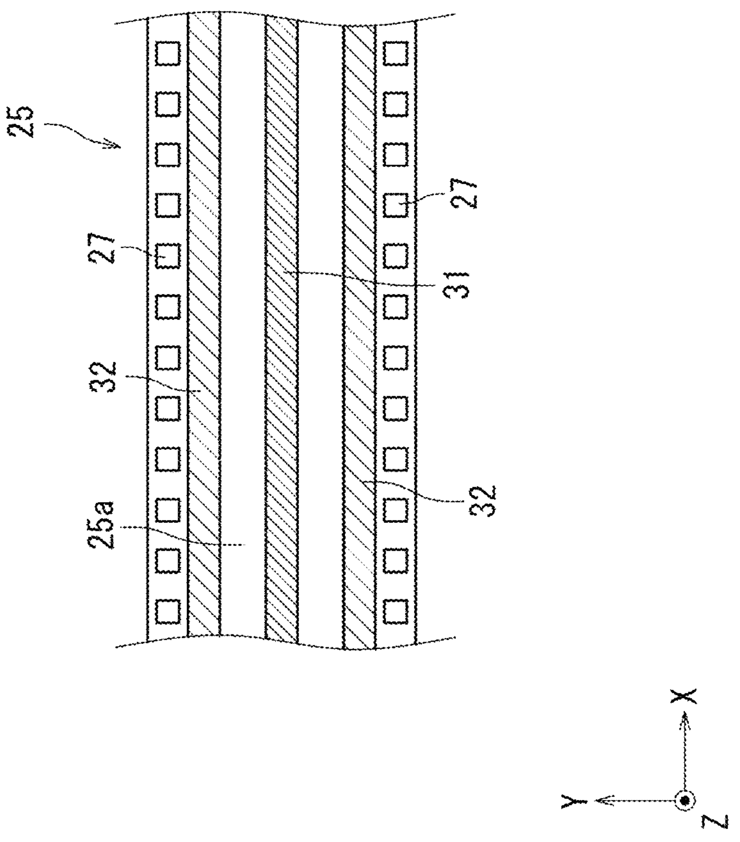
FIG. 14B is a partial enlarged view illustrating an example of a plurality of first protrusions provided in a first inner layer resin.

FIG. 14A is a vertical cross-sectional view of a multilayer substrate 109 according to the eighth example embodiment. FIG. 14B is a partial enlarged view illustrating an example of a plurality of first protrusions 27 provided on the first inner layer resin 25.

The multilayer substrate 109 according to the eighth example embodiment is different from the multilayer substrate 100 according to the first example embodiment in that the plurality of first protrusions 27 are further provided in addition to the configuration of the multilayer body 10.

As illustrated in FIG. 14A, the multilayer body 10 further includes the plastic resin layers 78 and 79. The plastic resin layer 78 is disposed between the plastic resin layers 71 and 72, and the plastic resin layer 79 is disposed between the plastic resin layers 72 and 73. The plastic resin layers 78 and 79 have, for example, the same or substantially the same shape as the plastic resin layer 73.

As illustrated in FIGS. 14A and 14B, the multilayer substrate 109 further includes the first protrusions 27. Specifically, the first inner layer resin 25 includes the plurality of first protrusions 27 that protrude in the thickness direction T of the multilayer body 10. More specifically, the plurality of first protrusions 27 are provided on both of the third main surface 25*a* and the fourth main surface 25*b* of the first inner layer resin 25 in the thickness direction T. The plurality of first protrusions 27 have the same or approximately the same shapes and the same or approximately the same dimensions.

In the multilayer substrate 109, each of the plurality of first protrusions 27 has a cuboid shape. On the third main surface 25*a* of the first inner layer resin 25, the plurality of first protrusions 27 are disposed in an outer side portion of the plurality of conductors 30 in the view in the thickness direction T. Specifically, in the view in the thickness direction T, the plurality of first protrusions 27 are disposed in both outer side portions of the plurality of conductors 30 in the width direction W in which the plurality of conductors 30 are arranged. On the third main surface 25*a* of the first inner layer resin 25, heights of the plurality of first protrusions 27 in the thickness direction T are larger than thicknesses of the plurality of conductors 30 in the thickness direction T. The heights of the plurality of first protrusions 27 in the thickness direction T are smaller than a distance between the first inner wall 10A of the multilayer body 10 and the third main surface 25*a* of the first inner layer resin 25 in the thickness direction T.

In the view in the thickness direction T, the plurality of first protrusions 27 provided on the fourth main surface 25*b* of the first inner layer resin 25 are provided at positions overlapping with the plurality of first protrusions 27 provided on the third main surface 25*a*. On the fourth main surface 25*b* of the first inner layer resin 25, the heights of the plurality of first protrusions 27 in the thickness direction T are smaller than a distance between the second inner wall 10B of the multilayer body 10 and the fourth main surface 25*b* of the first inner layer resin 25 in the thickness direction T.

As illustrated in FIG. 14B, in the multilayer substrate 109, the plurality of first protrusions 27 are positioned in outer side portions of two inner layer ground conductors 32. Specifically, in the view in the thickness direction T, the plurality of first protrusions 27 are disposed between end portions of the first inner layer resin 25 in the width direction W and the inner layer ground conductors 32. The plurality of first protrusions 27 are disposed at intervals along the substrate extending direction S. For example, the plurality of first protrusions 27 are disposed at equal or substantially equal intervals along the substrate extending direction S.

According to such a configuration, since the multilayer substrate 109 includes the plurality of first protrusions 27, a case where the first inner layer resin 25 and the plurality of conductors 30 approach the first ground conductor 36 and the second ground conductor 38 can be reduced or prevented. Accordingly, variations in impedance of the signal conductor 31 can be reduced or prevented.

While an example in which the plurality of first protrusions 27 are provided on the first inner layer resin 25 has been described in the present example embodiment, the present invention is not limited to this. One or more first protrusions 27 may be provided on the first inner layer resin 25. For example, one or more first protrusions 27 may be provided on the third main surface 25*a* or the fourth main surface 25*b* of the first inner layer resin 25.

It is possible that the plurality of first protrusions 27 are not provided on both of the third main surface 25*a* and the fourth main surface 25*b* of the first inner layer resin 25 in the thickness direction T. For example, the plurality of first protrusions 27 may be provided on at least one of the third main surface 25*a* or the fourth main surface 25*b* of the first inner layer resin 25. For example, the plurality of first protrusions 27 may be provided on at least a surface on a mountain fold side in a case where the multilayer substrate 109 is bent.

Shapes of the first protrusions 27 are not limited and may be, for example, cylindrical or substantially cylindrical shapes or triangular or substantially triangular pyramid shapes. Cross-sectional shapes of the first protrusions 27 are also not limited.

The first protrusions 27 may be disposed in other than the outer side portion of the plurality of conductors 30. For example, the first protrusions 27 may be disposed between the plurality of conductors 30. In this case, in the width direction W, widths of the first protrusions 27 provided on the third main surface 25*a* of the first inner layer resin 25 are smaller than an interval between the plurality of conductors 30. Distances between the first protrusions 27 and the signal conductor 31 in the width direction W may be smaller than distances between the inner layer ground conductors 32 and the signal conductor 31. The presence of the first protrusions 27 closer to the signal conductor 31 than the inner layer ground conductors 32 can further reduce or prevent variations in impedance.

While an example in which the plurality of first protrusions 27 are disposed at equal or substantially equal intervals along the substrate extending direction S has been described in the present example embodiment, the present invention is not limited to this. For example, one continuous first protrusion 27 may be provided along the substrate extending direction S.

While an example in which the plurality of first protrusions 27 are have the same or approximately the same shapes and the same or approximately the same dimensions has been described in the present example embodiment, the present invention is not limited to this. For example, the plurality of first protrusions 27 may have different shapes or different dimensions.

Ninth Example Embodiment

Hereinafter, a multilayer substrate according to a ninth example embodiment of the present invention will be described with reference to the accompanying drawings.

Figure 15A:
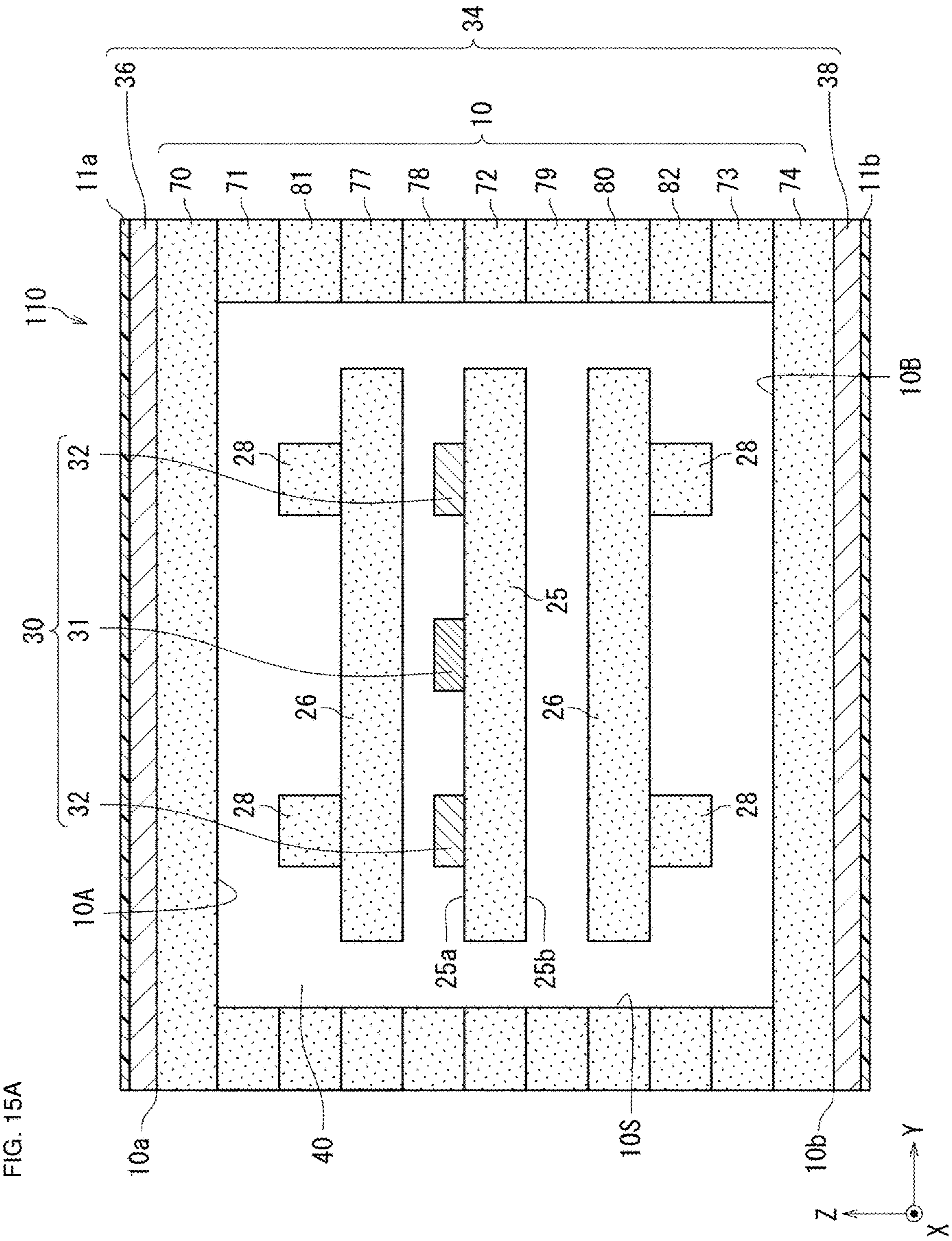
FIG. 15A is a vertical cross-sectional view of a multilayer substrate according to a ninth example embodiment of the present invention.
Figure 15B:
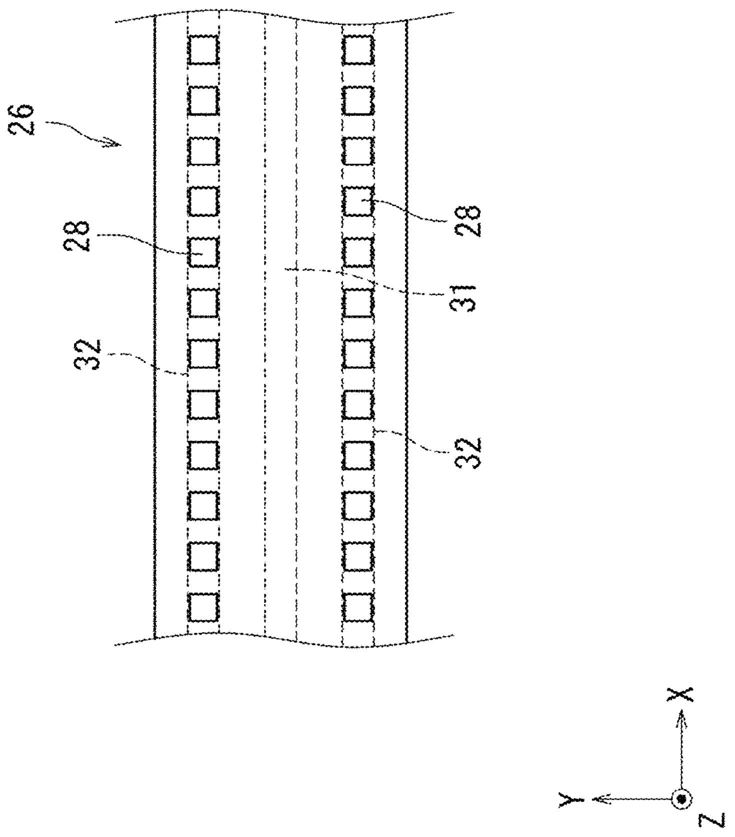
FIG. 15B is a partial enlarged view illustrating an example of a plurality of second protrusions provided in the second inner layer resin.

FIG. 15A is a vertical cross-sectional view of a multilayer substrate 110 according to the ninth example embodiment. FIG. 15B is a partial enlarged view illustrating an example of a plurality of second protrusions 28 provided on the second inner layer resins 26.

The multilayer substrate 110 according to the ninth example embodiment is different from the multilayer substrate 105 according to the fourth example embodiment in that the plurality of second protrusions 28 are further provided in addition to the configuration of the multilayer body 10.

As illustrated in FIG. 15A, the multilayer body 10 further includes plastic resin layers 81 and 82. The plastic resin layer 81 is disposed between the plastic resin layers 71 and 77. The plastic resin layer 82 is disposed between the plastic resin layers 80 and 73. The plastic resin layers 81 and 82 have, for example, the same or substantially the same shape as the plastic resin layer 73.

As illustrated in FIGS. 15A and 15B, the multilayer substrate 110 further includes the plurality of second protrusions 28. Specifically, the second inner layer resins 26 include the plurality of second protrusions 28 that protrude in the thickness direction T of the multilayer body 10. The plurality of second protrusions 28 have the same or approximately the same shapes and the same or approximately the same dimensions.

In the multilayer substrate 110, the plurality of second protrusions 28 are disposed at positions not overlapping with the signal conductor 31 in the view in the thickness direction T. The plurality of second protrusions 28 are positioned between the inner layer ground conductors 32 and the conductive shield materials 34. In the present example embodiment, the plurality of second protrusions 28 are disposed at positions overlapping with the inner layer ground conductors 32 in the view in the thickness direction T.

The plurality of second protrusions 28 are disposed at intervals along the substrate extending direction S. For example, the plurality of second protrusions 28 are disposed at equal or substantially equal intervals along the substrate extending direction S in the view in the thickness direction T.

In the multilayer substrate 110, each of the plurality of second protrusions 28 has a cuboid shape. In the second inner layer resin 26 disposed between the first inner layer resin 25 and the plastic resin layer 70, heights of the plurality of second protrusions 28 in the thickness direction T are smaller than a distance between the first inner wall 10A of the multilayer body 10 and the second inner layer resin 26. In the second inner layer resin 26 disposed between the first inner layer resin 25 and the plastic resin layer 74, heights of the plurality of second protrusions 28 in the thickness direction T are smaller than a distance between the second inner wall 10B of the multilayer body 10 and the second inner layer resin 26.

According to such a configuration, since the multilayer substrate 110 includes the plurality of second protrusions 28, a case where the first inner layer resin 25 and the plurality of conductors 30 approach the first ground conductor 36 and the second ground conductor 38 can be reduced or prevented. Accordingly, variation in impedance of the signal conductor 31 can be reduced or prevented.

The plurality of second protrusions 28 are disposed at positions not overlapping with the signal conductor 31 in the view in the thickness direction T. Such a configuration reduces the dielectric constant and the dissipation factor around the signal conductor 31 and improves the electrical characteristics.

While an example in which the plurality of second protrusions 28 are provided in each of two second inner layer resins 26 has been described in the present example embodiment, the present invention is not limited to this. For example, the plurality of second protrusions 28 may be provided in at least one second inner layer resin 26. For example, the plurality of second protrusions 28 may be provided on a surface of the second inner layer resin 26 on a mountain fold side in a case where the multilayer substrate 110 is bent.

Shapes of the second protrusions 28 are not limited and may be, for example, cylindrical or substantially cylindrical shapes or triangular or substantially triangular pyramid shapes. Cross-sectional shapes of the second protrusions 28 are also not limited.

While an example in which the plurality of second protrusions 28 are provided at positions overlapping with the inner layer ground conductors 32 in the view in the thickness direction T has been described in the present example embodiment, the present invention is not limited to this. For example, the plurality of second protrusions 28 may be provided at positions not overlapping with the inner layer ground conductors 32 in the view in the thickness direction T.

While an example in which the plurality of second protrusions 28 are provided on the second inner layer resins 26 has been described in the present example embodiment, the present invention is not limited to this. One or more second protrusions 28 may be provided on the second inner layer resins 26.

While an example in which the plurality of second protrusions 28 have the same or approximately the same shapes and the same or approximately the same dimensions has been described in the present example embodiment, the present invention is not limited to this. For example, the plurality of second protrusions 28 may have different shapes or different dimensions.

Tenth Example Embodiment

Hereinafter, a multilayer substrate according to a tenth example embodiment of the present invention will be described with reference to the accompanying drawings.

Figure 16:
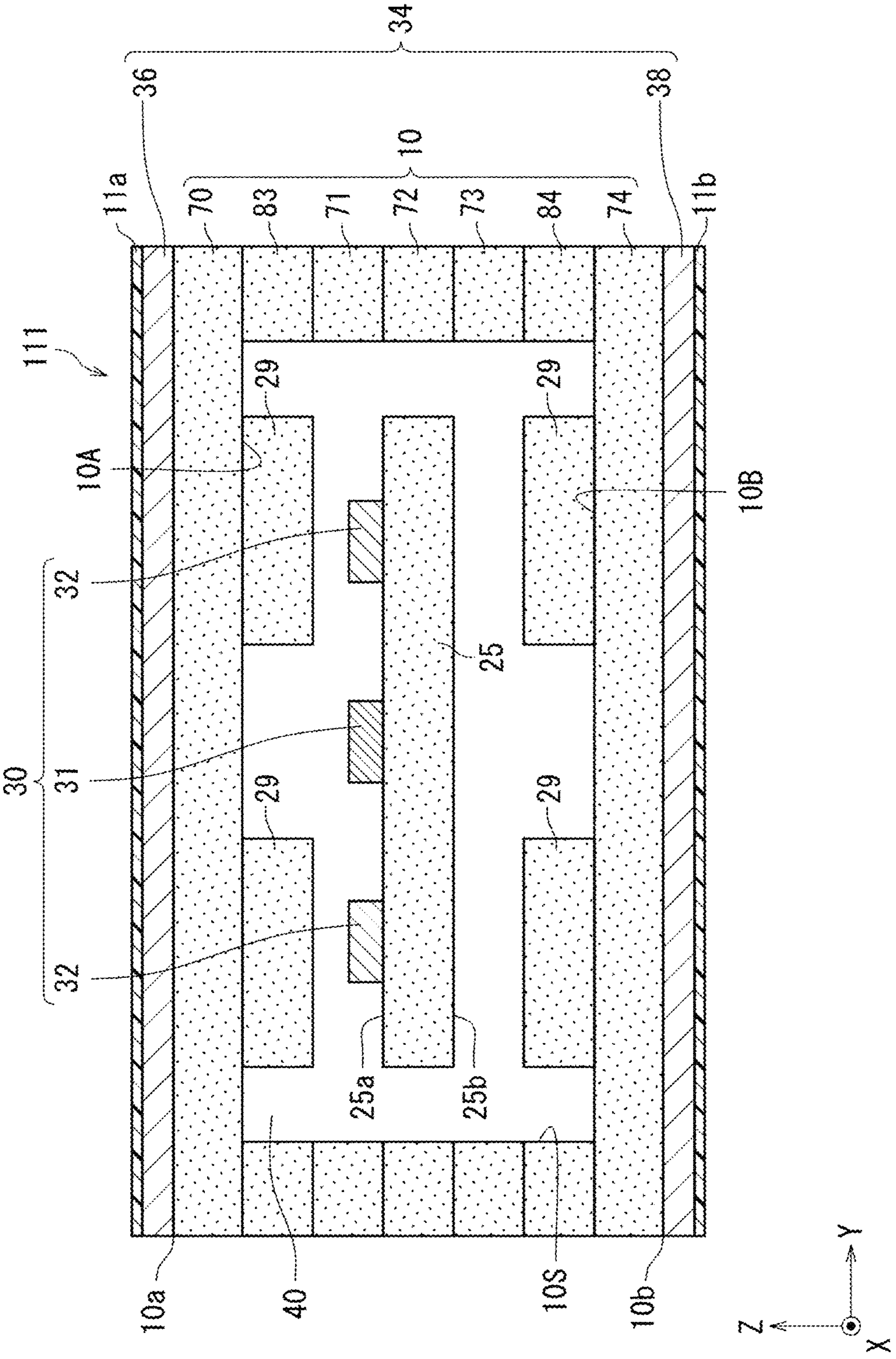
FIG. 16 is a vertical cross-sectional view of a multilayer substrate according to a tenth example embodiment of the present invention.
Figure 17:
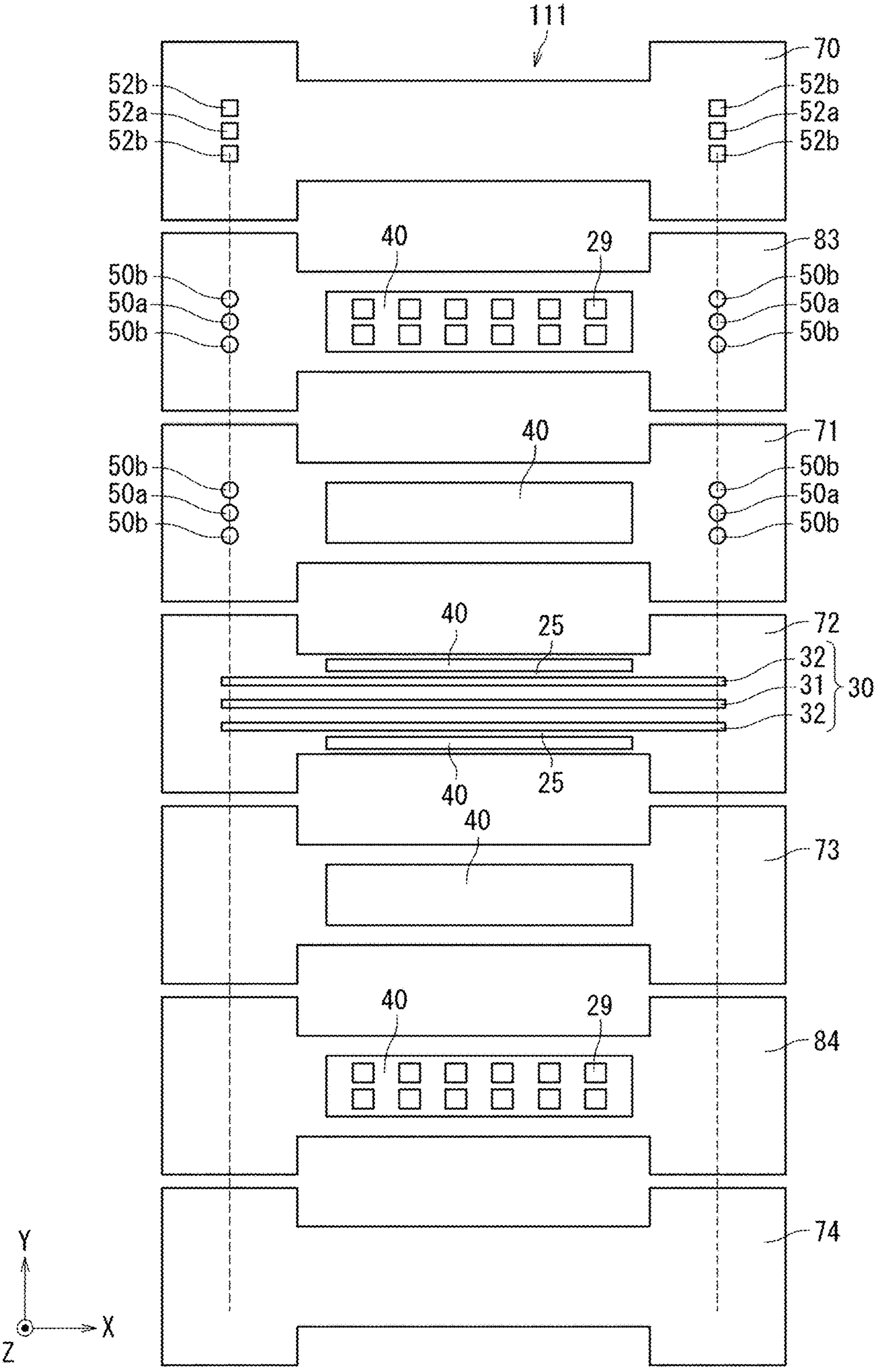
FIG. 17 is an exploded top view of the multilayer substrate according to the tenth example embodiment of the present invention.
Figure 18:
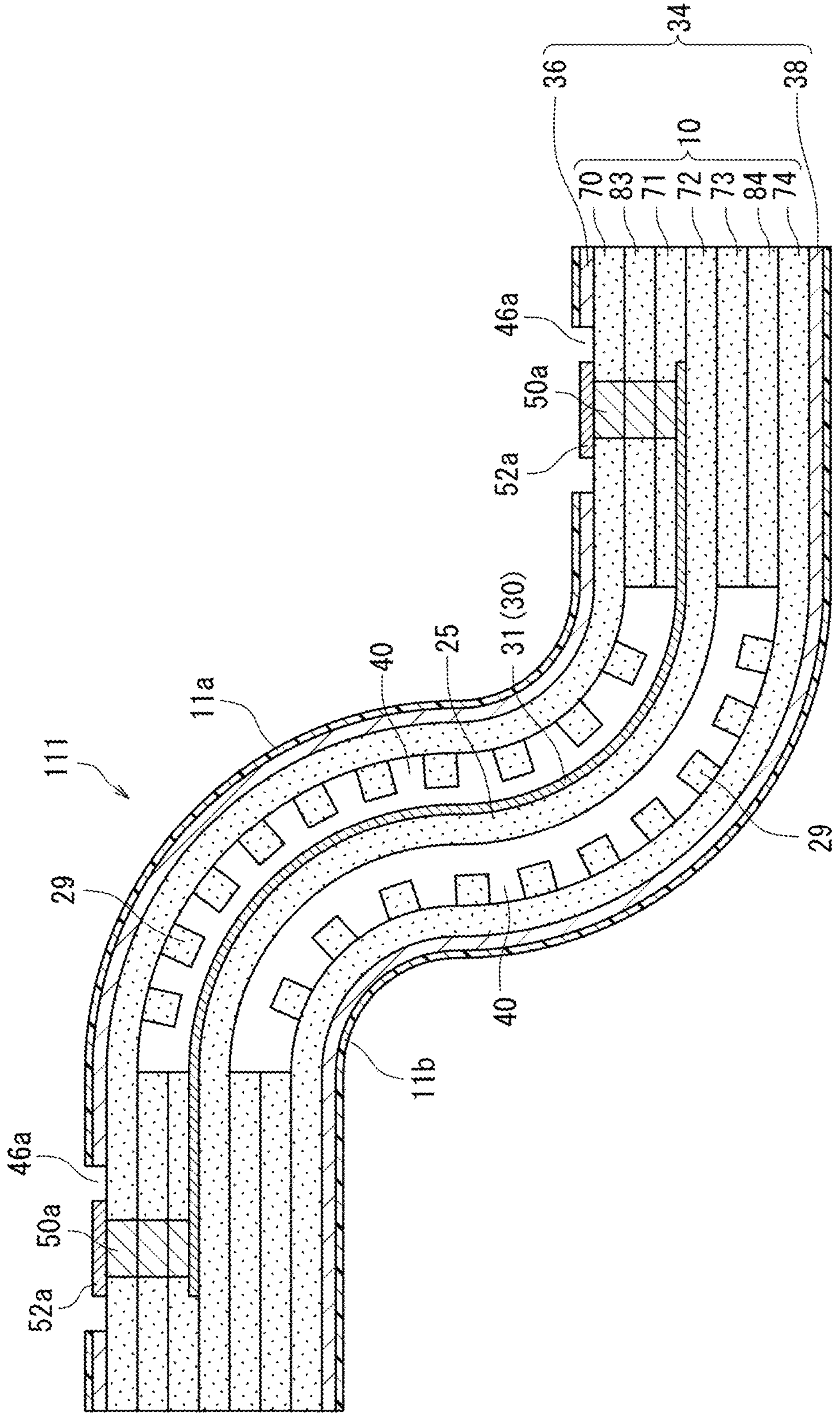
FIG. 18 is a horizontal cross-sectional view of the multilayer substrate after deformation according to the tenth example embodiment of the present invention.

FIG. 16 is a vertical cross-sectional view of a multilayer substrate 111 according to the tenth example embodiment. FIG. 17 is an exploded top view of the multilayer substrate 111 according to the tenth example embodiment. FIG. 18 is a horizontal cross-sectional view of the multilayer substrate 111 after deformation according to the tenth example embodiment.

The multilayer substrate 111 according to the tenth example embodiment is different from the multilayer substrate 100 according to the first example embodiment in that a plurality of third protrusions 29 are further provided in addition to the configuration of the multilayer body 10.

As illustrated in FIGS. 16 and 17, the multilayer body 10 further includes plastic resin layers 83 and 84.

The plastic resin layer 83 is disposed between the plastic resin layers 70 and 71. The plastic resin layer 84 is disposed between the plastic resin layers 73 and 74. The plastic resin layers 83 and 84 have, for example, the same or substantially the same shape as the plastic resin layer 73.

The multilayer substrate 111 further includes the plurality of third protrusions 29. Specifically, the multilayer substrate 111 includes the plurality of third protrusions 29 that protrude in the thickness direction T of the multilayer body 10. The plurality of third protrusions 29 are provided on inner surfaces of the multilayer body 10. Specifically, the plurality of third protrusions 29 are provided on the first inner wall 10A and the second inner wall 10B of the multilayer body 10. The plurality of third protrusions 29 provided on the first inner wall 10A of the multilayer body 10 protrude from the first inner wall 10A to the third main surface 25*a* of the first inner layer resin 25 in the thickness direction T. The plurality of third protrusions 29 provided on the second inner wall 10B of the multilayer body 10 protrude from the second inner wall 10B to the fourth main surface 25*b* of the first inner layer resin 25.

In the multilayer substrate 111, the plurality of third protrusions 29 are disposed at positions not overlapping with the signal conductor 31 in the view in the thickness direction T. The plurality of third protrusions 29 are positioned between the inner layer ground conductors 32 and the conductive shield materials 34. In the present example embodiment, the plurality of third protrusions 29 are disposed at positions overlapping with the inner layer ground conductors 32 in the view in the thickness direction T.

The plurality of third protrusions 29 are disposed at intervals along the substrate extending direction S. For example, the plurality of third protrusions 29 are disposed at equal or substantially equal intervals along the substrate extending direction S. The plurality of third protrusions 29 have the same or approximately the same shapes and the same or approximately the same dimensions.

In the multilayer substrate 111, each of the plurality of third protrusions 29 has a cuboid shape. Heights of the plurality of third protrusions 29 in the thickness direction T are smaller than a distance between the inner surfaces of the multilayer body 10 in the thickness direction T and the first inner layer resin 25. Specifically, the heights of the plurality of third protrusions 29 provided on the first inner wall 10A of the multilayer body 10 are smaller than the distance between the first inner wall 10A and the third main surface 25*a* of the first inner layer resin 25. The plurality of third protrusions 29 provided on the second inner wall 10B of the multilayer body 10 are smaller than the distance between the second inner wall 10B and the fourth main surface 25*b* of the first inner layer resin 25.

As illustrated in FIG. 18, in a case where the multilayer substrate 111 is folded in the thickness direction T, an outer side portion of the multilayer body 10 bends to deform. The first inner layer resin 25 and the plurality of conductors 30 deform in accordance with deformation of the multilayer body 10. The plurality of third protrusions 29 protruding from the inner surfaces of the multilayer body 10 reduce or prevent a case where the first inner layer resin 25 and the plurality of conductors 30 approach the first ground conductor 36 and the second ground conductor 38. For example, in a case where the first inner layer resin 25 deforms, the first inner layer resin 25 comes into contact with the plurality of third protrusions 29. Accordingly, a state where the first inner layer resin 25 is separated from the first ground conductor 36 and the second ground conductor 38 can be maintained.

According to such a configuration, since the multilayer substrate 111 includes the plurality of third protrusions 29, a case where the first inner layer resin 25 and the plurality of conductors 30 approach the first ground conductor 36 and the second ground conductor 38 can be reduced or prevented. Accordingly, variations in impedance of the signal conductor 31 can be reduced or prevented.

The plurality of third protrusions 29 are disposed at positions not overlapping with the signal conductor 31 in the view in the thickness direction T. Such a configuration reduces the dielectric constant and the dissipation factor around the signal conductor 31 and improves the electrical characteristics.

While an example in which the plurality of third protrusions 29 are provided on the inner surfaces of the multilayer body 10 has been described in the present example embodiment, the present invention is not limited to this. For example, one or more third protrusions 29 may be provided on the inner surfaces of the multilayer body 10.

While an example in which the plurality of third protrusions 29 are provided on both of the first inner wall 10A and the second inner wall 10B of the multilayer body 10 has been described in the present example embodiment, the present invention is not limited to this. For example, the plurality of third protrusions 29 may be provided on at least one of the first inner wall 10A or the second inner wall 10B. For example, the plurality of third protrusions 29 may be provided on an inner surface of the multilayer body 10 on a mountain fold side in a case where the multilayer substrate 111 is bent.

Shapes of the third protrusions 29 are not limited and may be, for example, cylindrical or substantially cylindrical shapes or triangular or substantially triangular pyramid shapes. Cross-sectional shapes of the third protrusions 29 are also not limited.

The third protrusions 29 may be disposed at positions not overlapping with the inner layer ground conductors 32 in the view in the thickness direction T.

While an example in which the plurality of third protrusions 29 have the same or approximately the same shapes and the same or approximately the same dimensions has been described in the present example embodiment, the present invention is not limited to this. For example, the plurality of third protrusions 29 may have different shapes or different dimensions.

Eleventh Example Embodiment

Hereinafter, a multilayer substrate according to an eleventh example embodiment of the present invention will be described with reference to the accompanying drawings.

Figure 19:
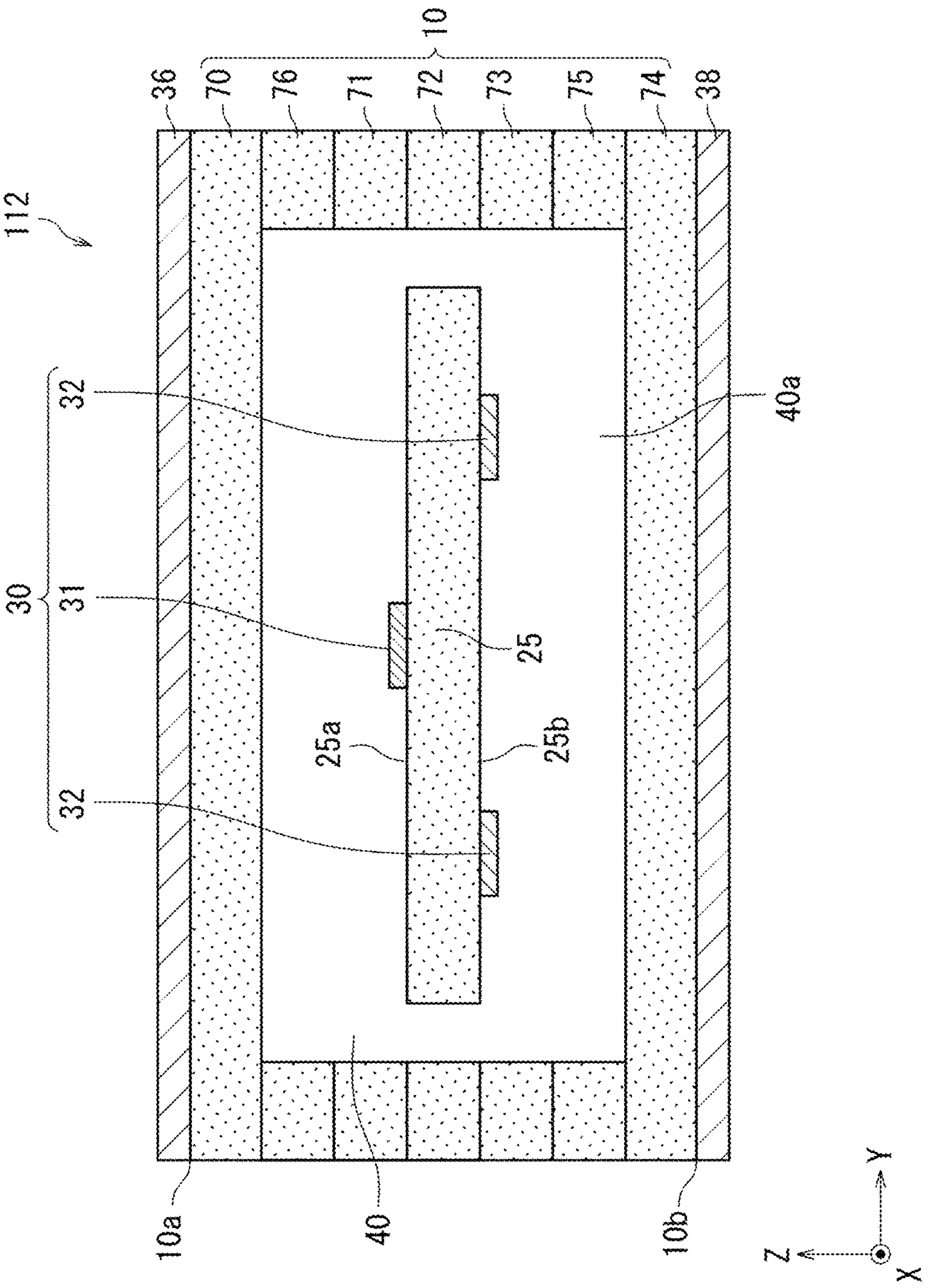
FIG. 19 is a vertical cross-sectional view of a multilayer substrate according to an eleventh example embodiment of the present invention.

FIG. 19 is a vertical cross-sectional view of a multilayer substrate 112 according to the eleventh example embodiment.

The multilayer substrate 112 according to the eleventh example embodiment is different from the multilayer substrate 100 according to the first example embodiment in the configuration of the multilayer body 10 and in that the plurality of conductors 30 are provided on the third main surface 25*a* and the fourth main surface 25*b* of the first inner layer resin 25.

As illustrated in FIG. 19, in the multilayer substrate 112, the multilayer body 10 includes plastic resin layers 71 to 76. The plastic resin layers 71 to 73 and 75 and 76 are disposed between the plastic resin layers 70 and 74.

In the multilayer substrate 112, the plurality of conductors 30 are provided on the third main surface 25*a* and the fourth main surface 25*b* of the first inner layer resin 25. In the present example embodiment, the signal conductor 31 is provided on the third main surface 25*a*, and the inner layer ground conductors 32 are provided on the fourth main surface 25*b*.

As described above, it is possible that the plurality of conductors 30 are not provided on the same surface of the first inner layer resin 25.

Even in such a configuration, the same or substantially the same advantageous effects as the multilayer substrate 100 of the first example embodiment can be achieved.

While an example of providing the signal conductor 31 on the third main surface 35*a* of the first inner layer resin 25 and providing the inner layer ground conductors 32 on the fourth main surface 25*b* has been described in the present example embodiment, the present invention is not limited to this. For example, the signal conductor 31 may be provided on the fourth main surface 25*b*, and the inner layer ground conductors 32 may be provided on the third main surface 25*a*.

Twelfth Example Embodiment

Hereinafter, a multilayer substrate according to a twelfth example embodiment of the present invention will be described with reference to the accompanying drawings.

Figure 20:
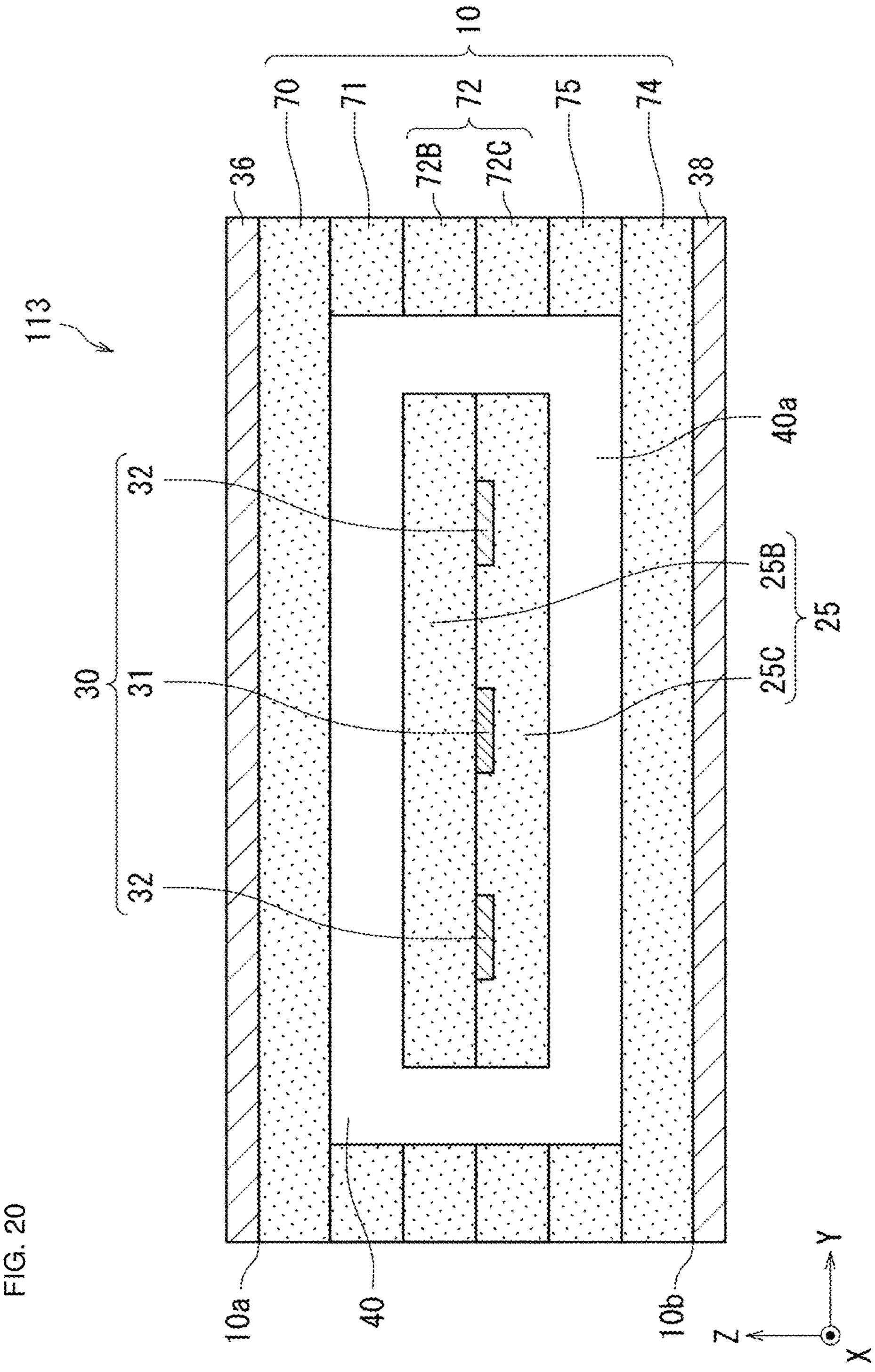
FIG. 20 is a vertical cross-sectional view of a multilayer substrate according to a twelfth example embodiment of the present invention.

FIG. 20 is a vertical cross-sectional view of a multilayer substrate 113 according to the twelfth example embodiment.

The multilayer substrate 113 according to the twelfth example embodiment is different from the multilayer substrate 100 according to the first example embodiment in the configuration of the multilayer body 10 and in that the plurality of conductors 30 are embedded in the first inner layer resin 25.

As illustrated in FIG. 20, in the multilayer substrate 113, the multilayer body 10 includes the plastic resin layers 71 to 74. The plastic resin layer 72 includes two plastic resin layers 72B and 72C. The plastic resin layer 72C is laminated with the plastic resin layer 72B.

The plastic resin layers 72B and 72C define the first inner layer resin 25. That is, the first inner layer resin 25 is defined by a portion of the plastic resin layers 72B and 72C.

The first inner layer resin 25 includes an inner layer resin 25B and an inner layer resin 25C. The inner layer resin 25C is laminated with the inner layer resin 25B. In the present example embodiment, the inner layer resin 25B is defined by a portion of the plastic resin layer 72B. The inner layer resin 25C is defined by a portion of the plastic resin layer 72C.

The plurality of conductors 30 are embedded in the first inner layer resin 25. Specifically, the plurality of conductors 30 are covered with the inner layer resin 25B and the inner layer resin 25C.

As described above, it is possible that the plurality of conductors 30 are embedded in the first inner layer resin 25 and are not exposed from the first inner layer resin 25.

Even in such a configuration, the same or substantially the same advantageous effects as the multilayer substrate 100 of the first example embodiment can be achieved.

Since the plurality of conductors 30 can be protected by the first inner layer resin 25, the quality of the multilayer substrate 113 can be improved.

Thirteenth Example Embodiment

Hereinafter, a multilayer substrate according to a thirteenth example embodiment of the present invention will be described with reference to the accompanying drawings.

Figure 21:
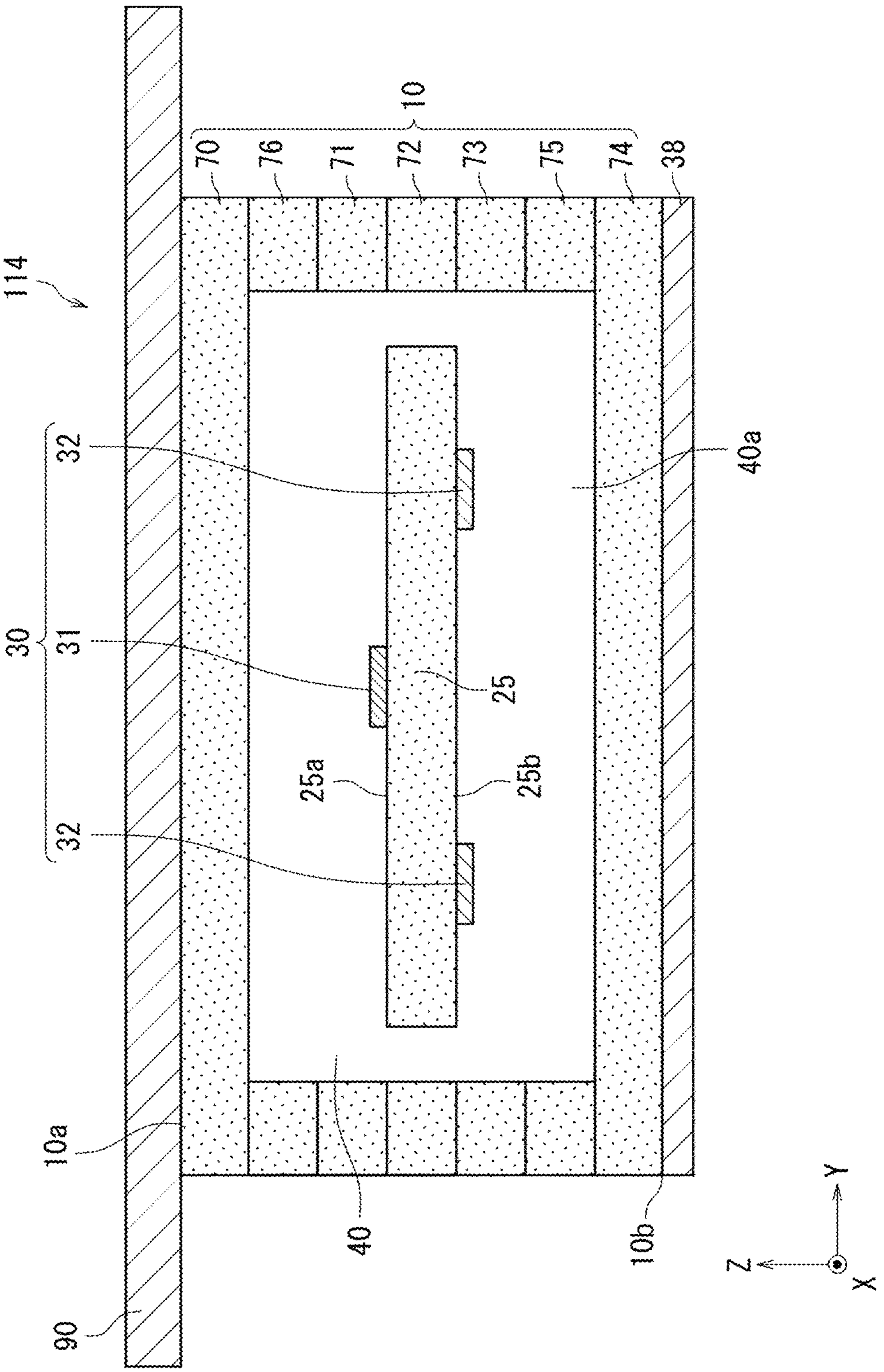
FIG. 21 is a vertical cross-sectional view of a multilayer substrate according to a thirteenth example embodiment of the present invention.

FIG. 21 is a vertical cross-sectional view of a multilayer substrate 114 according to the thirteenth example embodiment.

The multilayer substrate 114 according to the thirteenth example embodiment is different from the multilayer substrate 100 according to the first example embodiment in the configuration of the multilayer body 10 and in that the first main surface 10*a* of the multilayer body 10 is disposed in contact with a wall surface of a housing 90.

As illustrated in FIG. 21, in the multilayer substrate 114, the multilayer body 10 includes the plastic resin layers 71 to 76.

In the multilayer substrate 114, a ground conductor is not provided on the first main surface 10*a* of the multilayer body 10, and the wall surface of the housing 90 is disposed on the first main surface 10*a* of the multilayer body 10.

The housing 90 is made of, for example, metal. The housing 90 is, for example, a casing of a battery pack. The housing 90 may be made of a shield material.

As described above, in the multilayer substrate 114, the housing 90 may be disposed on the first main surface 10*a* of the multilayer body 10 without providing a ground conductor on the first main surface 10*a* of the multilayer body 10. Even in such a configuration, the same or substantially the same advantageous effects as the multilayer substrate 100 of the first example embodiment can be achieved.

Fourteenth Example Embodiment

Hereinafter, a multilayer substrate according to a fourteenth example embodiment of the present invention will be described with reference to the accompanying drawings.

Figure 22:
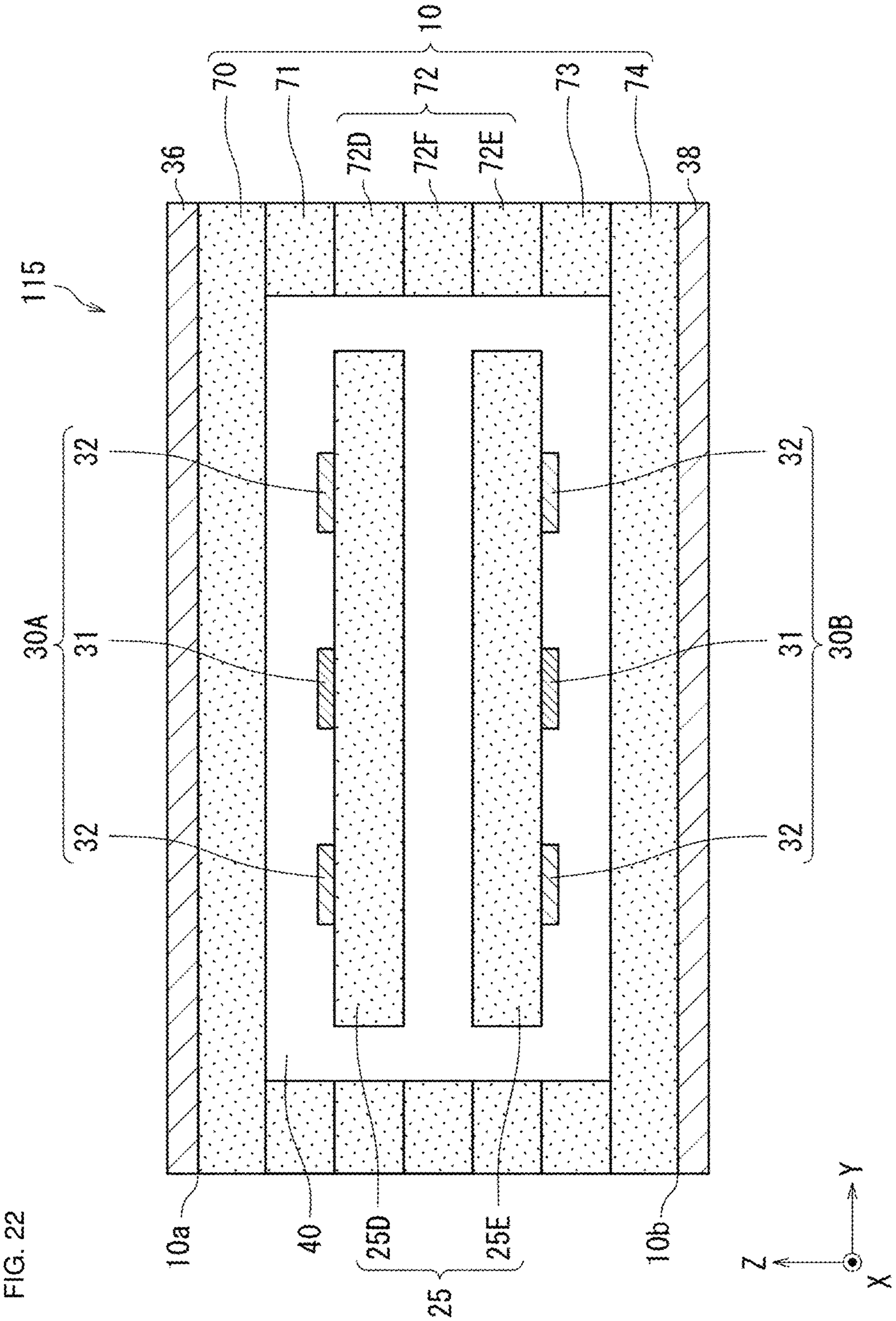
FIG. 22 is a vertical cross-sectional view of a multilayer substrate according to a fourteenth example embodiment of the present invention.

FIG. 22 is a vertical cross-sectional view of a multilayer substrate 115 according to the fourteenth example embodiment.

The multilayer substrate 115 according to the fourteenth example embodiment is different from the multilayer substrate 100 according to the first example embodiment in the configuration of the multilayer body 10 and in that two inner layer resins 25D and 25E on which the plurality of conductors 30 are provided are provided.

As illustrated in FIG. 22, in the multilayer substrate 115, the multilayer body 10 includes the plastic resin layers 71 to 74. The plastic resin layer 72 includes three plastic resin layers 72D, 72E, and 72F. The plastic resin layer 72E is laminated with the plastic resin layer 72F, and the plastic resin layer 72F is laminated with the plastic resin layer 72D. That is, the plastic resin layer 72F is provided between the plastic resin layers 72D and 72E.

The first inner layer resin 25 includes two inner layer resins 25D and 25E. Two inner layer resins 25D and 25E are spaced away from each other in the lamination direction (Z direction) of the multilayer body 10. In the present example embodiment, the inner layer resin 25D is defined by a portion of the plastic resin layer 72D. The inner layer resin 25E is defined by a portion of the plastic resin layer 72E.

The inner layer resin 25D has a sheet shape extending in the substrate extending direction S of the multilayer substrate 115. A plurality of conductors 30A are provided on a surface of the inner layer resin 25D. The plurality of conductors 30A include the signal conductor 31 and the inner layer ground conductors 32 and define a coplanar line.

The inner layer resin 25E has a sheet shape extending in the substrate extending direction S of the multilayer substrate 115. A plurality of conductors 30B are provided on a surface of the inner layer resin 25E. The plurality of conductors 30B include the signal conductor 31 and the inner layer ground conductors 32 and define a coplanar line.

As described above, in the multilayer substrate 115, the first inner layer resin 25 includes two inner layer resins 25D and 25F that are spaced away from each other in the lamination direction (Z direction) of the multilayer body 10. The plurality of conductors 30A and 30B are provided on two inner layer resins 25D and 25F, respectively. That is, in the first inner layer resin 25, two coplanar lines provided on two inner layer resins 25D and 25F run parallel or substantially parallel to each other in the lamination direction (Z direction). Even in such a configuration, the same or substantially the same advantageous effects as the multilayer substrate 100 of the first example embodiment can be achieved.

While an example in which the first inner layer resin 25 includes two inner layer resins 25D and 25F on which the plurality of conductors 30A and 30B are provided, the present invention is not limited to this. For example, the first inner layer resin 25 may include two or more inner layer resins, and the plurality of conductors 30 may be provided on each of two or more inner layer resins.

As described above, the example embodiments and the modified examples have been described as an example of the technology disclosed in the present disclosure. However, the technology in the present disclosure is not limited to this and can be applied to, for example, an example embodiment that is changed, replaced, added, or omitted, as appropriate. Therefore, other example embodiments will be described below.

The conductive shield material 34 may be provided by, for example, a conductive paste or a conductive seal. The present configuration increases shielding properties.

For example, in a case where the multilayer body 10 is provided with the through-holes 53 and 54, a conductive seal may be used as the conductive shield material 34. The conductive seal can increase the shielding properties while closing the through-holes 53 and 54.

In a case where the multilayer substrate is bent or folded, the conductive shield material 34 such as a conductive paste or a conductive seal may be provided after bending or folding. Using the present method can reduce or prevent an occurrence of cracks in the conductive shield material 34.

While example embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A multilayer substrate comprising:
- a multilayer body including a plurality of laminated plastic resin layers and a space inside the multilayer body;
- a first inner layer resin in the space; and
- a plurality of conductors including a signal conductor and provided on the first inner layer resin; wherein
- at least a portion of the first inner layer resin is separated from the multilayer body in the space;
- the plurality of conductors include a plurality of inner layer ground conductors;
- the signal conductor is between the plurality of inner layer ground conductors;
- the multilayer body includes a first main surface and a second main surface facing each other in a lamination direction of the multilayer body;
- the multilayer substrate further includes a plurality of conductive shield materials on the first main surface and on the second main surface;
- in the lamination direction, the plurality of conductive shield materials overlap with the signal conductor; and
- in a cross section in a direction perpendicular or substantially perpendicular to an extending direction of the signal conductor, the first inner layer resin is floating from the multilayer body.

2. The multilayer substrate according to claim 1, wherein at least a portion of the multilayer body or the first inner layer resin includes a plurality of first through-holes.

3. The multilayer substrate according to claim 2, wherein the plurality of first through-holes overlap with the signal conductor in a lamination direction of the multilayer body in the first inner layer resin.

4. The multilayer substrate according to claim 1, wherein the first inner layer resin includes a first protrusion protruding in a lamination direction of the multilayer body.

5. The multilayer substrate according to claim 4, wherein the first protrusion is provided in an outer side portion of the plurality of conductors in a direction in which the plurality of conductors are arranged.

6. The multilayer substrate according to claim 1, further comprising:
- a plurality of second inner layer resins positioned at an interval in a lamination direction of the multilayer body in the space of the multilayer body; wherein
- the first inner layer resin is provided between the plurality of second inner layer resins.

7. The multilayer substrate according to claim 6, wherein at least one of the plurality of second inner layer resins includes a second protrusion protruding in the lamination direction.

8. The multilayer substrate according to claim 7, wherein, in the lamination direction of the multilayer body, the second protrusion does not overlap with the signal conductor.

9. The multilayer substrate according to claim 1, wherein the multilayer body includes an inner surface defining the space, and a third protrusion protruding from the inner surface in a lamination direction of the multilayer body.

10. The multilayer substrate according to claim 9, wherein in the lamination direction of the multilayer body, the third protrusion does not overlap with the signal conductor.

11. The multilayer substrate according to claim 1, wherein the conductive shield materials include at least one of a metal foil, a conductive paste, or a conductive seal.

12. The multilayer substrate according to claim 1, wherein
- the conductive shield materials are connected to a ground potential;
- the plurality of conductors include an inner layer ground conductor;
- the multilayer substrate further includes a plurality of second inner layer resins arranged at an interval in the lamination direction at positions overlapping with the inner layer ground conductor in the view in the lamination direction in the space of the multilayer body; and
- the first inner layer resin is provided between the plurality of second inner layer resins in the lamination direction.

13. The multilayer substrate according to claim 12, wherein at least one of the plurality of second inner layer resins include with a second through-hole overlapping with the signal conductor in the lamination direction.

14. The multilayer substrate according to claim 12, wherein the multilayer body includes a third through-hole overlapping with the signal conductor in the lamination direction.

15. The multilayer substrate according to claim 1, wherein the first inner layer resin extends in an extending direction of the signal conductor; and the first inner layer resin is connected to the multilayer body in the extending direction.

16. The multilayer substrate according to claim 1, wherein in a lamination direction of the multilayer body, the signal conductor includes a first portion provided in the space, and a second portion extending from an inside of the multilayer body and connected to the first portion; and in the lamination direction of the multilayer body, a width of the first portion is larger than a width of the second portion.

* * * * *